(12) United States Patent
Wang et al.

(10) Patent No.: US 12,230,561 B2
(45) Date of Patent: Feb. 18, 2025

(54) LIGHT-EMITTING SUBSTRATE AND DISPLAY APPARATUS

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Jie Wang, Beijing (CN); Jian Tian, Beijing (CN); Jie Lei, Beijing (CN); Xintao Wu, Beijing (CN); Chunjian Liu, Beijing (CN); Qin Zeng, Beijing (CN); Zouming Xu, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 574 days.

(21) Appl. No.: 17/511,371

(22) Filed: Oct. 26, 2021

(65) Prior Publication Data
US 2022/0130747 A1 Apr. 28, 2022

(30) Foreign Application Priority Data
Oct. 26, 2020 (CN) .......................... 202011158086.2

(51) Int. Cl.
*H01L 23/498* (2006.01)
*H01L 33/62* (2010.01)
(52) U.S. Cl.
CPC ........ *H01L 23/49838* (2013.01); *H01L 33/62* (2013.01)
(58) Field of Classification Search
CPC . H01L 23/49838; H01L 33/62; H01L 25/167; H01L 25/0753; G02F 1/133603
See application file for complete search history.

(56) References Cited

U.S. PATENT DOCUMENTS

| 5,432,358 A | * | 7/1995 | Nelson | H01L 25/167 |
| | | | | 257/E25.032 |
| 2009/0085861 A1 | * | 4/2009 | Lee | G09G 3/342 |
| | | | | 345/102 |

(Continued)

FOREIGN PATENT DOCUMENTS

| CN | 109300430 A | 2/2019 |
| CN | 110620108 A | 12/2019 |

(Continued)

OTHER PUBLICATIONS

The First Office Action of Priority Application No. CN 202011158086.2 issued by the Chinese Patent Office on Oct. 14, 2022.

*Primary Examiner* — Galina G Yushina
(74) *Attorney, Agent, or Firm* — IP & T GROUP LLP

(57) ABSTRACT

A light-emitting substrate includes a base, a first conductive pattern layer disposed on the base and a second conductive pattern layer disposed on a side of the first conductive pattern layer away from the base. The first conductive pattern layer includes first signal lines. The second conductive pattern layer includes lamp bead pads. The lamp bead pads include first lamp bead pads and at least one second lamp bead pad. A vertical projection of each first lamp bead pad on the base at least partially overlaps with a vertical projection of a first signal line on the base. A vertical projection of each second lamp bead pad on the base is outside vertical projections of the first signal lines on the base. A distance between a first lamp bead pad and the base is substantially the same as a distance between a second lamp bead pad and the base.

20 Claims, 20 Drawing Sheets

(56) References Cited

U.S. PATENT DOCUMENTS

| | | | | |
|---|---|---|---|---|
| 2009/0161039 A1* | 6/2009 | Toyama | ............ | G02F 1/133603 |
| | | | | 313/499 |
| 2010/0052564 A1* | 3/2010 | Park | ................. | H05B 41/2822 |
| | | | | 315/291 |
| 2016/0249420 A1* | 8/2016 | Zhang | ................ | H05B 45/3725 |
| 2019/0393389 A1* | 12/2019 | Chen | ....................... | H01L 33/62 |
| 2020/0028044 A1* | 1/2020 | Lee | .................... | H01L 25/0753 |
| 2020/0204255 A1* | 6/2020 | Deng | ................. | H04B 10/502 |

FOREIGN PATENT DOCUMENTS

| | | | | | |
|---|---|---|---|---|---|
| CN | 111025793 | A | 4/2020 | | |
| CN | 111627953 | * | 9/2020 | ............ | H01L 27/15 |
| CN | 111627953 | A | 9/2020 | | |

\* cited by examiner

LIGHT-EMITTING SUBSTRATE AND DISPLAY APPARATUS

CROSS-REFERENCE TO RELATED APPLICATION

The present disclosure claims priority to Chinese Patent Application No. 202011158086.2, filed on Oct. 26, 2020, which is incorporated herein by reference in its entirety.

TECHNICAL FIELD

The present disclosure relates to the field of display technologies, and in particular, to a light-emitting substrate and a display apparatus.

BACKGROUND

In recent years, ultra-small-pitch backlight and display technologies have developed rapidly. Compared with a conventional liquid crystal display, a liquid crystal display (LCD) using an ultra-small-pitch backlight product (e.g., a mini light-emitting diode (Mini LED) backlight product) may achieve dimming in a smaller region, and has a better brightness uniformity and a higher color contrast, and is lighter and thinner. In addition, a display effect thereof is substantially the same as that of an organic light-emitting diode (OLED) display, a cost thereof is only approximately 60% of that of the OLED display, and a service life thereof is greatly prolonged.

SUMMARY

In an aspect, a light-emitting substrate is provided. The light-emitting substrate includes a base, a first conductive pattern layer, and a second conductive pattern layer. The first conductive pattern layer is disposed on the base, and includes a plurality of first signal lines. The second conductive pattern layer is disposed on a side of the first conductive pattern layer away from the base, and includes a plurality of lamp bead pads. The plurality of lamp bead pads include a plurality of first lamp bead pads and at least one second lamp bead pad. A vertical projection of each first lamp bead pad on the base at least partially overlaps with a vertical projection of a first signal line on the base. A vertical projection of each second lamp bead pad on the base is outside vertical projections of the plurality of first signal lines on the base. A distance between a first lamp bead pad and the base is substantially the same as a distance between a second lamp bead pad and the base.

In some embodiments, the first conductive pattern layer further includes at least one spacer, and each spacer is insulated from the plurality of first signal lines. The vertical projection of the second lamp bead pad on the base is within a vertical projection of a spacer on the base.

In some embodiments, the spacer includes a pattern. Or, the second lamp bead pad includes an anode pad and a cathode pad, the spacer includes a first pattern and a second pattern arranged at an interval. A vertical projection of the anode pad of the second lamp bead pad on the base is within a vertical projection of the first pattern on the base. A vertical projection of the cathode pad of the second lamp bead pad on the base is within a vertical projection of the second pattern on the base.

In some embodiments, the second lamp bead pad is insulated from the spacer.

In some embodiments, a number of the at least one spacer is equal to a number of the at least one second lamp bead pad.

In some embodiments, the spacer includes a pattern, and the at least one second lamp bead pad includes a plurality of second lamp bead pads. In the plurality of second lamp bead pads, vertical projections of at least two second lamp bead pads on the base are within a vertical projection of a same spacer on the base.

In some embodiments, the at least two second lamp bead pads are connected in series.

In some embodiments, the light-emitting substrate has two edges opposite to each other in a first direction, and an effective light-emitting region and a fan-out region that are located between the two edges and distributed in a second direction. The first direction intersects with the second direction. Each first signal line extends in the effective light-emitting region and the fan-out region. The at least one second lamp bead pad is provided in a region outside a region occupied by the plurality of first signal lines in the fan-out region.

In some embodiments, the second conductive pattern layer further includes a plurality of light-emitting driver pads, and the plurality of first signal lines include a plurality of driving voltage lines. The plurality of lamp bead pads are divided into a plurality of pad groups, each pad group is composed of lamp bead pads connected in series, and both terminal of the pad group are electrically connected to a driving voltage line and a light-emitting driver pad. The plurality of pad groups include a first pad group. The first pad group includes at least one first lamp bead pad and at least one second lamp bead pad connected in series. Or, the first pad group includes at least two second lamp bead pads connected in series.

In some embodiments, the first pad group is located in the fan-out region. The first pad group is farther away from the effective light-emitting region than a light-emitting driver pad electrically connected to the first pad group.

In some embodiments, the plurality of pad groups further includes a plurality of second pad groups, and the plurality of second pad groups and the first pad group are arranged in the second direction. In the first pad group, in an order from a driving voltage line connected to the first pad group to a light-emitting driver pad connected to the first pad group, a second lamp bead pad is farther away from the plurality of second pad groups than a first lamp bead pad. In a second pad group, in an order from a driving voltage line connected to the second pad group to a light-emitting driver pad connected to the second pad group, a second lamp bead pad is farther away from the first pad group than a first lamp bead pad.

In some embodiments, a distance between a second pad group and an adjacent first pad group is a first distance, and a distance between two adjacent second pad groups in the second direction is a second distance; the first distance is substantially the same as the second distance.

In some embodiments, a light-emitting driver pad electrically connected to a second pad group adjacent to the first pad group is located on a side of the second pad group in the first direction.

In some embodiments, the plurality of first signal lines include a plurality of source voltage lines and a plurality of common voltage lines. The light-emitting substrate further includes a plurality of light-emitting drivers. A light-emitting driver is electrically connected to a light-emitting driver pad. The light-emitting driver includes a first input pin, an output pin, and a common voltage pin. The first input pin is electrically connected to a source voltage line, the output pin is electrically connected to a pad group, and the common voltage pin is electrically connected to a common voltage line.

In some embodiments, the plurality of first signal lines further include a plurality of source address lines and a plurality of feedback lines. The light-emitting driver further includes a second input pin. The plurality of light-emitting drivers are cascaded, and in the plurality of cascaded light-emitting drivers, a second input pin of a first-stage light-emitting driver is electrically connected to a source address line. Except the first-stage light-emitting driver, an output pin of a present-stage light-emitting driver is electrically connected to a second input pin of a next-stage light-emitting driver. An output pin of a last-stage light-emitting driver is electrically connected to a feedback line.

In some embodiments, the second conductive pattern layer further includes a plurality of second signal lines. Each second signal line connects two adjacent lamp bead pads in a same pad group in series.

In some embodiments, materials of the first conductive pattern layer and the second conductive pattern layer each include at least one of copper, aluminum or silver.

In some embodiments, materials of the first conductive pattern layer and the second conductive pattern layer are the same.

In some embodiments, the lamp bead pads connected in series includes four or six lamp bead pads.

In another aspect, a display apparatus is provided. The display apparatus includes a display panel and the light-emitting substrate according to any one of the above embodiments. The display panel is disposed on a light-exit side of the light-emitting substrate. The light-emitting substrate is used to provide a light source for the display panel.

BRIEF DESCRIPTION OF THE DRAWINGS

In order to describe technical solutions in the present disclosure more clearly, accompanying drawings to be used in the description of some embodiments of the present disclosure will be introduced briefly below. However, the accompanying drawings to be described below are merely accompanying drawings of some embodiments of the present disclosure, and a person of ordinary skill in the art may obtain other drawings based on these drawings. In addition, the accompanying drawings to be described below may be regarded as schematic diagrams, but are not limitations on actual sizes of products, actual processes of methods and actual timings of signals to which the embodiments of the present disclosure relate.

DETAILED DESCRIPTION

Figure 1:
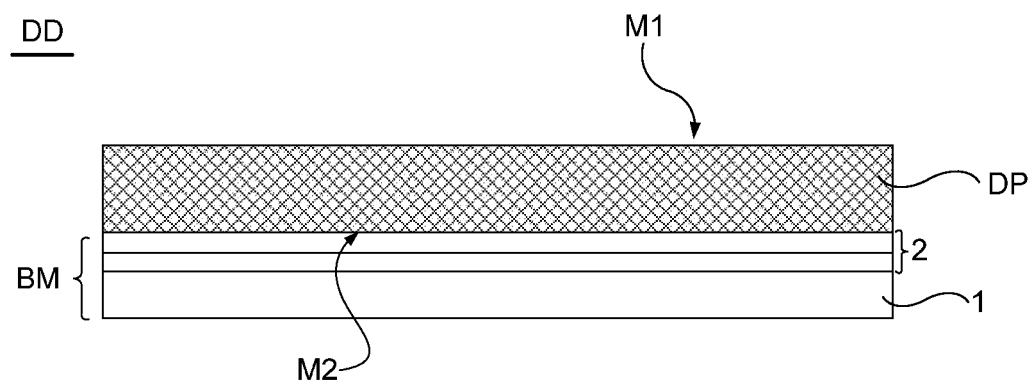
FIG. 1 is a diagram showing a structure of a display apparatus, in accordance with some embodiments of the present disclosure.

Technical solutions in some embodiments of the present disclosure will be described clearly and completely with reference to the accompanying drawings below. However, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as open and inclusive, i.e., "including, but not limited to". In the description, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features. Thus, features defined as "first" and "second" may explicitly or implicitly include one or more of the features. In the description of the embodiments of the present disclosure, the term "a plurality of" means two or more unless otherwise specified.

In addition, in the present disclosure, orientation terms such as "left", "right", "upper" and "lower" are defined relative to orientations in which components in the drawings are schematically placed. It will be understood that, these orientation terms are relative concepts and used for relative description and clarification, and may be changed correspondingly according to changes in the orientations in which the components in the drawings are placed.

In the description of some embodiments, the terms "coupled" and "connected" and their derivatives may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the contents herein.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

As used herein, the term "if", depending on the context, is optionally construed as "when" or "in a case where" or "in response to determining" or "in response to detecting". Similarly, the phrase "if it is determined" or "if [a stated condition or event] is detected", depending on the context, is optionally construed as "in a case where it is determined" or "in response to determining" or "in a case where [the stated condition or event] is detected" or "in response to detecting [the stated condition or event]".

The use of the phrase "applicable to" or "configured to" herein means/is meant as an open and inclusive language, which does not exclude devices that are applicable to or configured to perform additional tasks or steps.

In addition, the use of the phrase "based on" is meant to be open and inclusive, since a process, step, calculation or other action that is "based on" one or more of the stated conditions or values may, in practice, be based on additional conditions or values exceeding those stated.

The terms such as "about", "substantially" or "approximately" as used herein includes a stated value and an average value within an acceptable range of deviation of a particular value. The acceptable range of deviation is determined by a person of ordinary skill in the art in view of measurement in question and errors associated with measurement of a particular quantity (i.e., limitations of a measurement system).

The term such as "parallel", "perpendicular" or "equal" as used herein includes a stated condition and a condition similar to the stated condition. A range of the similar condition is within an acceptable range of deviation. The acceptable range of deviation is determined by a person of ordinary skill in the art in view of measurement in question and errors associated with measurement of a particular quantity (i.e., limitations of a measurement system). For example, the term "parallel" includes absolute parallelism and approximate parallelism, and an acceptable range of deviation of the approximate parallelism may be, for example, a deviation within 5°; the term "perpendicular" includes absolute perpendicularity and approximate perpendicularity, and an acceptable range of deviation of the approximate perpendicularity may also be, for example, a deviation within 5°; the term "equal" includes absolute equality and approximate equality, and an acceptable range of deviation of the approximate equality may be, for example, a difference between two equals of less than or equal to 5% of either of the two equals.

Exemplary embodiments are described herein with reference to sectional views and/or plan views as idealized exemplary drawings. In the accompanying drawings, thicknesses of layers and regions are enlarged for clarity. Thus, variations in shapes relative to the accompanying drawings due to, for example, manufacturing technologies and/or tolerances may be envisaged. Therefore, the exemplary embodiments should not be construed to be limited to the shapes of the regions shown herein, but to include deviations in the shapes due to, for example, manufacturing. For example, an etched region shown in a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

Some embodiments of the present disclosure provide a display apparatus. The display apparatus may be any product or component with a display function, such as a mobile phone, a tablet computer, a television, a display, a notebook computer, a digital photo frame, a navigator or an electronic book, which is not limited in the embodiments of the present disclosure.

FIG. 1 is a diagram showing a structure of a display apparatus, in accordance with some embodiments of the present disclosure. As shown in FIG. 1, in some embodiments, the display apparatus DD may include a liquid crystal display. The liquid crystal display may include a backlight module BM and a display panel DP. The display panel DP is a liquid crystal display panel, and may have a display surface M1 and a non-display surface M2 opposite to the display surface M1. The backlight module BM is disposed on the non-display surface M2 of the display panel DP, and is used to provide light (also referred to as backlight) to the display panel DP. The backlight module BM includes a light-emitting substrate 1 used as a light source, and may further include at least one (e.g., one or a plurality of) optical film 2 disposed on a light-exit side of the light-emitting substrate 1, which is, for example, at least one of a diffuser sheet or a prism sheet. By controlling deflection angles of liquid crystal molecules (not shown in the figure) in the display panel DP, the display apparatus DD may achieve a purpose of controlling brightness of each sub-pixel in the display panel DP, thereby achieving display with grayscales.

Some embodiments of the present disclosure provide a light-emitting apparatus. The light-emitting apparatus is a product capable of emitting light, and includes a light-emitting substrate, and may further include other components according to actual needs. In some possible implementations, the light-emitting apparatus may be used for illumination, and may be, for example, a backlight module. The backlight module may be configured in the display apparatus DD. In some other possible implementations, the light-emitting apparatus may be used to display an image, and content of the image may be pre-configured. For example, the light-emitting apparatus may be used as a decorative wall or a traffic light. In this case, the light-emitting apparatus may further include a protective layer disposed on the light-exit side of the light-emitting substrate.

Figure 2:
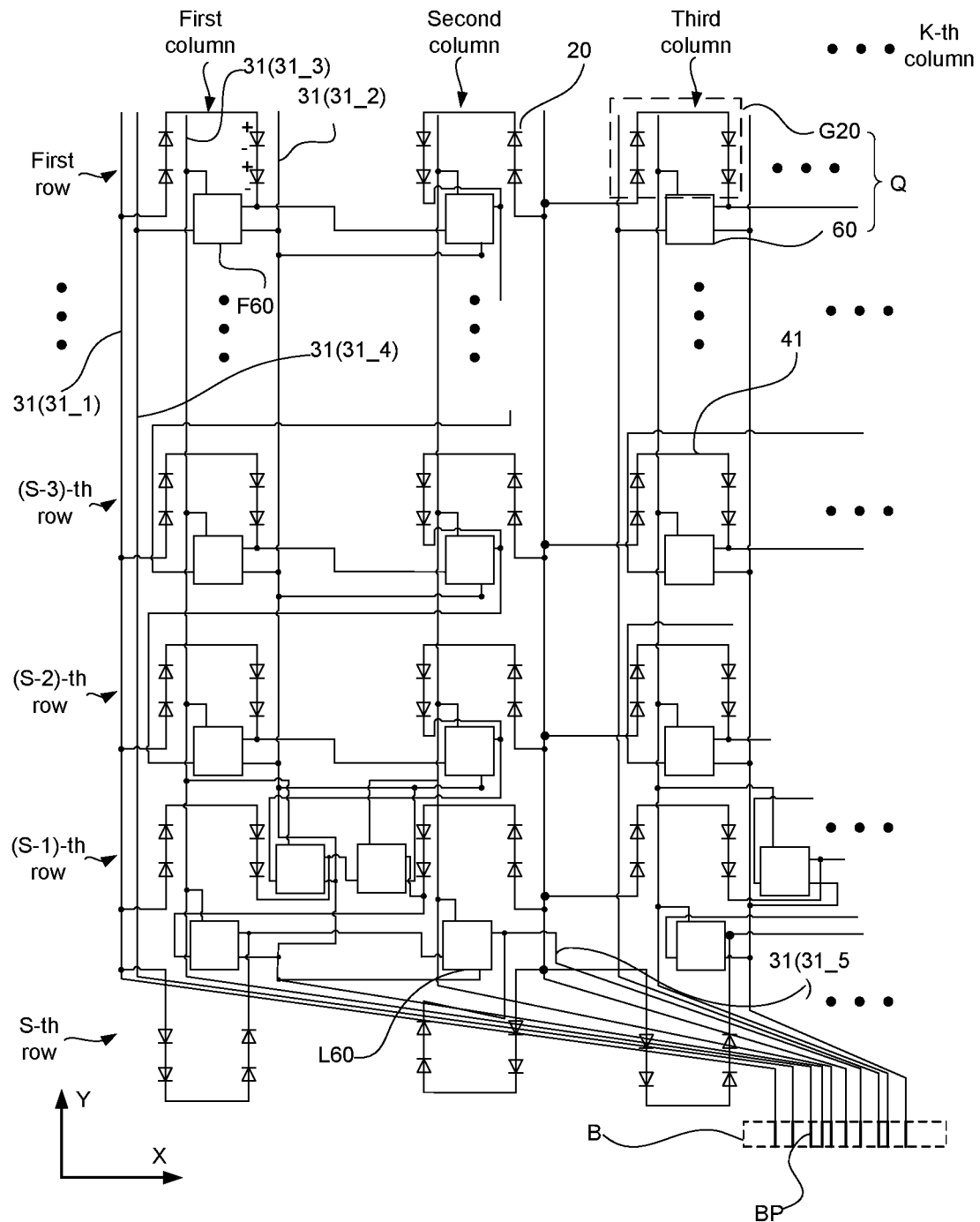
FIG. 2 is a connection diagram among components included in a light-emitting substrate, in accordance with some embodiments of the present disclosure.

FIG. 2 is a connection diagram among components included in a light-emitting substrate, in accordance with some embodiments of the present disclosure. Referring to FIG. 2, the light-emitting substrate 1 includes a base (not shown in FIG. 2), a driver circuit disposed on the base, a plurality of bonding pins BP (a region where the plurality of bonding pins BP being referred to as a bonding region B), and a plurality of lamp beads 20. Further, in order to achieve regional light control, the light-emitting substrate 1 may adopt an active matrix (AM) driving mode, that is, the light-emitting substrate 1 further includes a plurality of light-emitting drivers 60. Each bonding pin BP is configured to provide an electrical signal. The driver circuit is configured to electrically connect some bonding pins BP to some (e.g., a part of or all) light-emitting drivers 60, to electrically connect some other bonding pins BP to the lamp beads 20, to electrically connect each light-emitting driver 60 to at least one lamp bead 20, and to electrically connect some light-emitting drivers 60.

The lamp bead 20 is an element capable of emitting light after being energized, and may be referred to as a light-emitting device. For example, the lamp bead 20 may be a light-emitting diode (LED), a micro light-emitting diode (Micro LED), an organic light-emitting diode (OLED) or a quantum dot light-emitting diode (QLED), which is not limited herein. As an example, the lamp bead 20 may be a Micro light-emitting device, and for a size of the lamp bead 20, reference may be made to a size of the Micro LED. The Micro LED includes a light-emitting diode on an order of sub-millimeters or even microns, and may further include a light-emitting diode with a smaller size. The light-emitting diode on the order of sub-millimeters is also referred to as a mini light-emitting diode (Mini LED). A dimension (e.g., a length) of the Mini LED may be in a range of 50 μm to 150 μm, inclusive. For example, it is in a range of 80 μm to 120 μm, inclusive. The light-emitting diode on the order of microns is also referred to as a Micro LED. A dimension (e.g., a length) of the Micro LED may be less than 50 μm. For example, it is in a range of 10 μm to 50 μm, inclusive. Compared with a conventional liquid crystal display, a display apparatus using micro light-emitting devices as light sources may achieve dimming in a smaller region, has a better brightness uniformity and a higher color contrast, and is lighter and thinner.

A (e.g., each) lamp bead 20 is electrically connected to a light-emitting driver 60 through the driver circuit. The light-emitting driver 60 is configured to control brightness of the lamp bead 20. For example, the light-emitting driver 60 is configured to control a light-emitting current flowing through the lamp bead 20. For example, it is configured to provide a driving signal to the lamp bead 20 to control the current flowing through the lamp bead 20. In some embodiments, the driver chip 60 may be a display driver integrated circuit (DDIC).

In some embodiments, the plurality of lamp beads 20 included in the light-emitting substrate 1 may be divided into a plurality of lamp bead groups G20, and each lamp bead group G20 may include at least two lamp beads 20 connected in series. For example, the number of lamp beads in a (e.g., each) lamp bead group G20 is an even number, which is, for example, four or six. A lamp bead group G20 is electrically connected to a light-emitting driver 60. A lamp bead group G20 and a light-emitting driver 60 electrically connected thereto constitute a light-emitting unit Q. In this way, by using a light-emitting driver 60 to control a lamp bead group G20 electrically connected thereto, brightnesses of lamp beads 20 in the lamp bead group G20 may be controlled to simultaneously reach a preset brightness value. Based on this, a region occupied by a lamp bead group G20 may be directly opposite to a region where at least two sub-pixels in the display panel DP in FIG. 1 are located. As a result, by controlling brightness of the lamp bead group G20, brightness of backlight in the region where the plurality of sub-pixels are located may be controlled, and in turn, the regional light control may be achieved in the display apparatus.

In some other embodiments, the light-emitting substrate 1 in the embodiments of the present disclosure includes the base and the driver circuit, but is not provided with the lamp beads and/or the light-emitting drivers.

Figure 3:
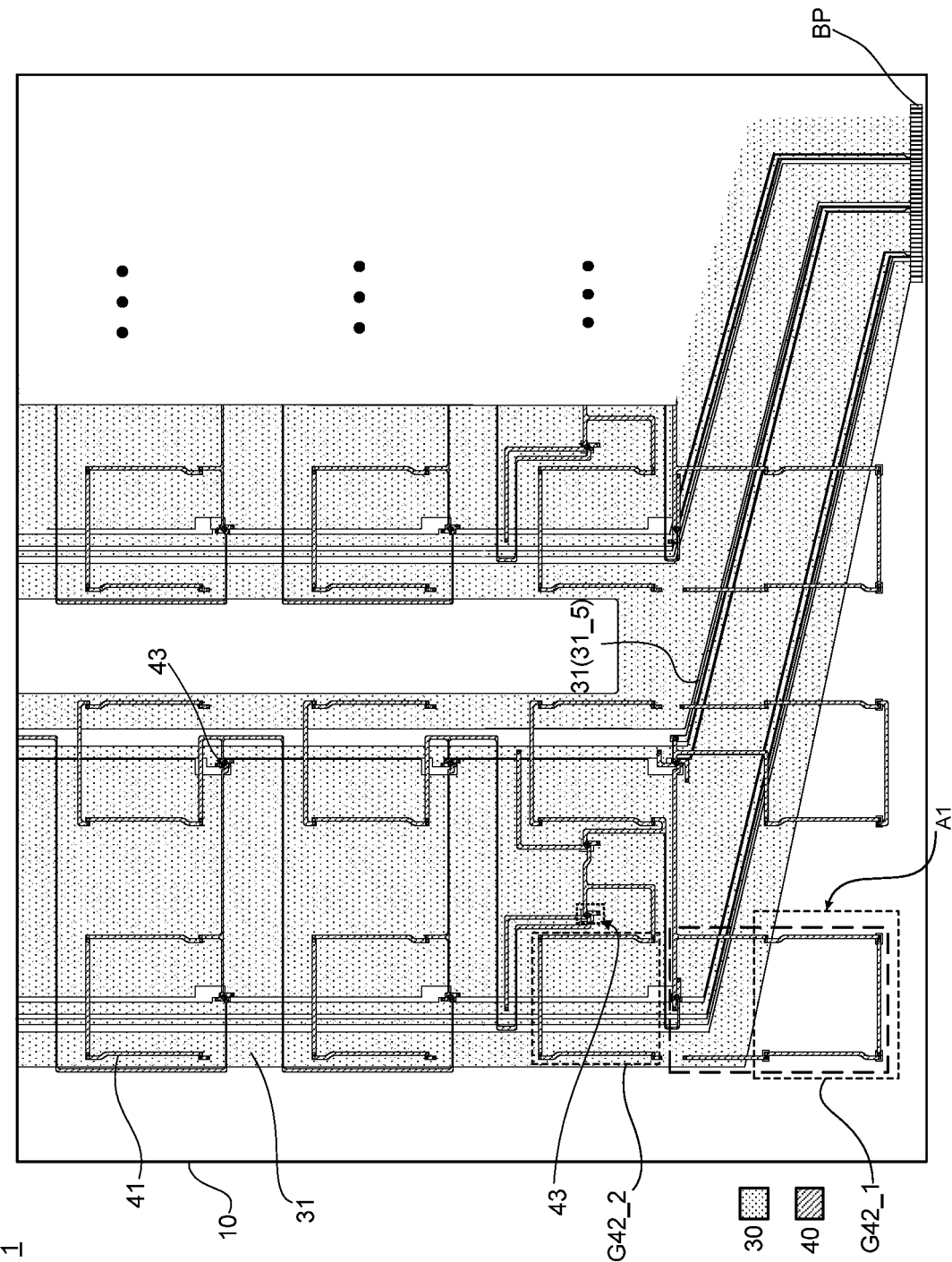
FIG. 3 is a local top view of a light-emitting substrate, in accordance with some embodiments of the present disclosure.
Figure 4:
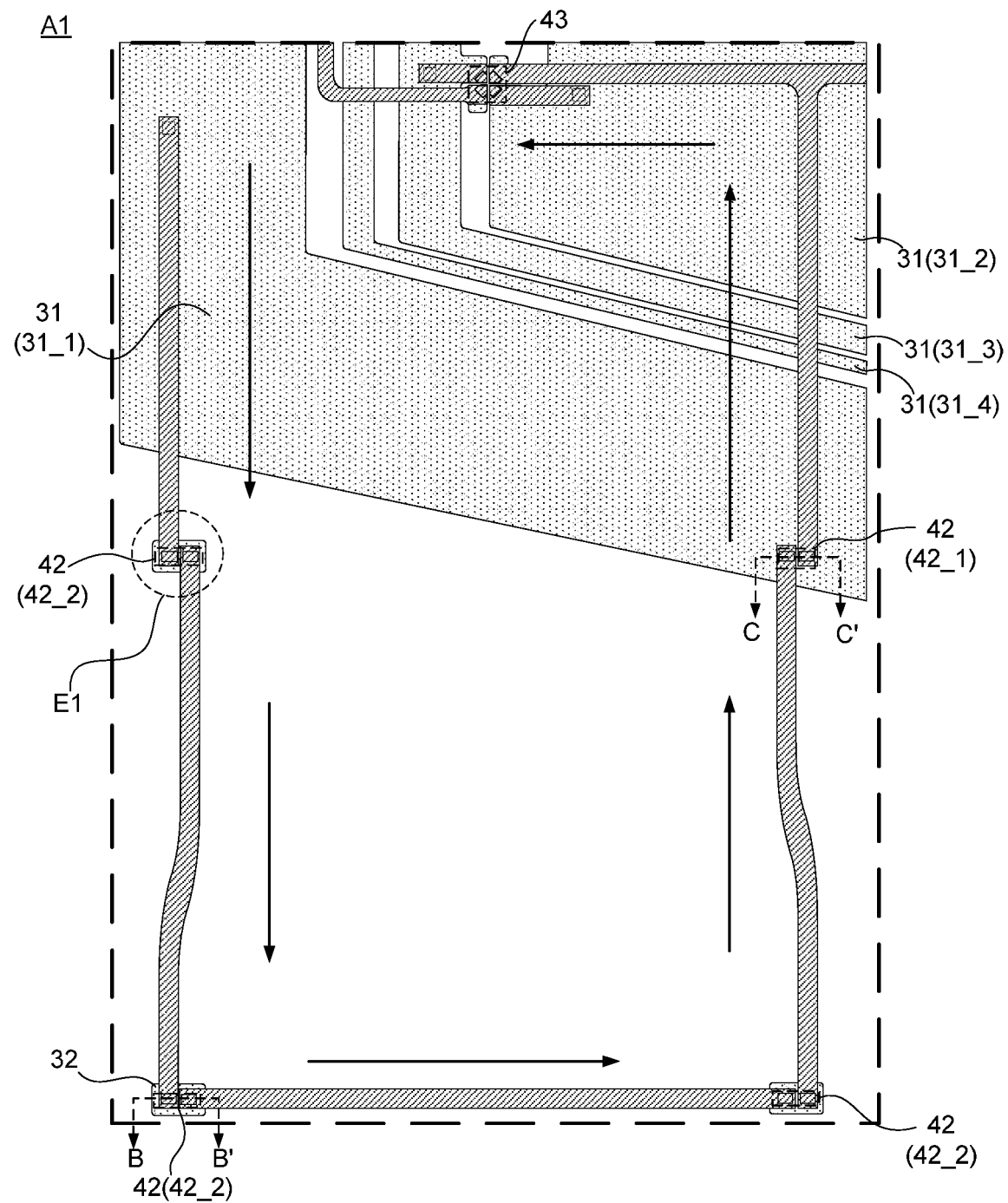
FIG. 4 is an enlarged view of the portion A1 in FIG. 3.
Figure 5:
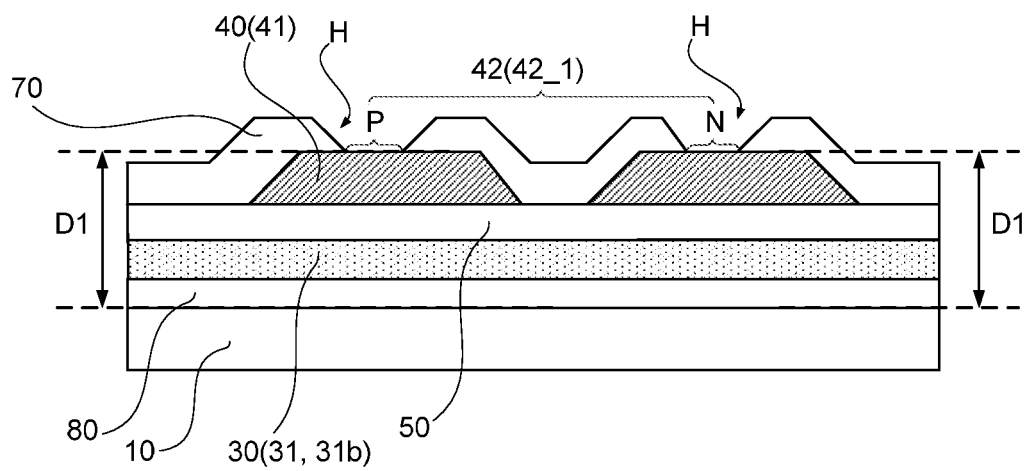
FIG. 5 is a sectional view of the light-emitting substrate taken along the line C-C' shown in FIG. 4.
Figure 6A:
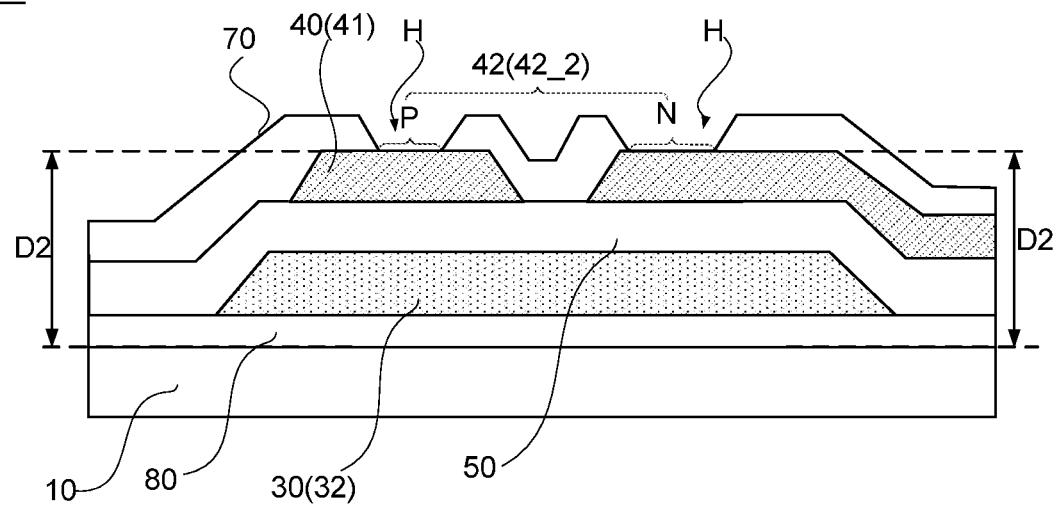
FIG. 6A is a sectional view of the light-emitting substrate taken along the line B-B' shown in FIG. 4.
Figure 6B:
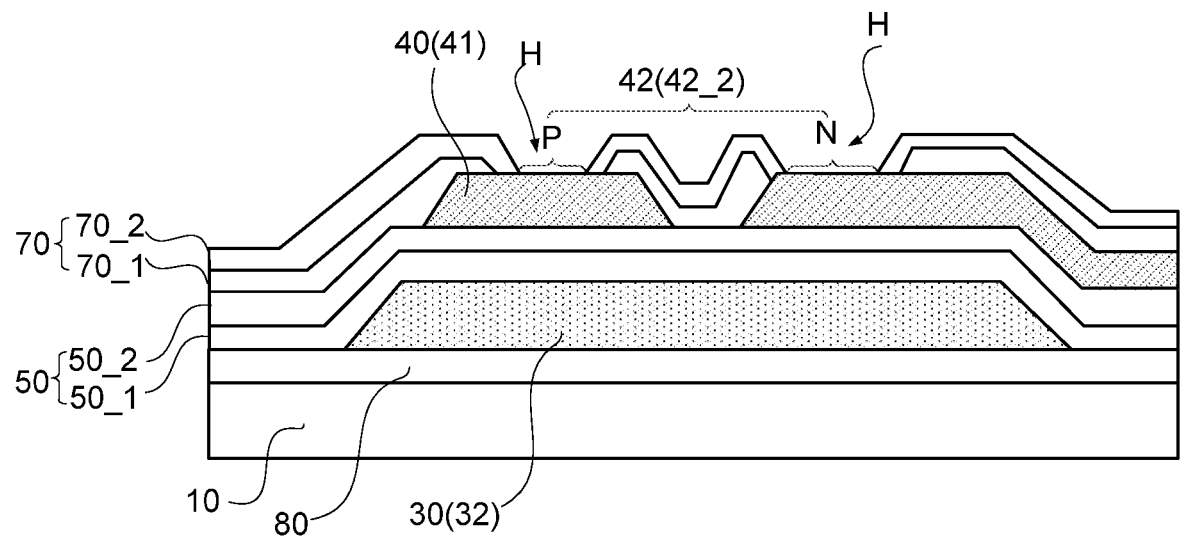
FIG. 6B is another sectional view of the light-emitting substrate taken along the line B-B' shown in FIG. 4.

FIG. 3 is a local top view of a light-emitting substrate, in accordance with some embodiments of the present disclosure. The lamp beads and the light-emitting drivers are not shown in FIG. 3. FIG. 4 is an enlarged view of the portion A1 in FIG. 3. FIG. 5 is a sectional view of the light-emitting substrate taken along the line C-C' shown in FIG. 4. FIGS. 6A and 6B are each a sectional view of the light-emitting substrate taken along the line B-B' shown in FIG. 4.

Referring to FIGS. 3 to 6B, a structure of the light-emitting substrate will be described in detail below.

In some embodiments, the light-emitting substrate 1 includes the base 10 and a first conductive pattern layer 30 disposed on the base 10.

The base 10 may be set according to actual needs. For example, the base may include a rigid base substrate. The rigid base substrate may be made of plastic, silicon, ceramic, glass, quartz, polymethyl methacrylate (PMMA), or the like. For another example, the base may include a flexible base substrate. The flexible base substrate may be made of polyethylene terephthalate (PET), polyethylene naphthalate two formic acid glycol ester (PEN), ultra-thin glass, polyimide (PI), or the like. In addition, the base 10 may further include at least one layer disposed on the base substrate (i.e., the rigid base substrate or the flexible base substrate).

As shown in FIGS. 3 to 5, the first conductive pattern layer 30 includes a plurality of first signal lines 31. Each first signal line 31 may be connected to at least one bonding pin BP. For example, the plurality of first signal lines 31 may include all signal lines located in the first conductive pattern layer 30 and used to drive the lamp beads 20 to emit light. In addition, the embodiments of the present disclosure do not limit a material of the first conductive pattern layer 30. For example, the material of the first conductive pattern layer 30 may include at least one of copper, aluminum or silver. The first conductive pattern layer 30 may be formed through a patterning process. For example, a film may be formed first through a sputtering process, and then a pattern layer may be formed through a photolithography process. It will be noted that, in the embodiments of the present disclosure, the photolithography process may include exposure, development, etching and other processes.

In some examples, as shown in FIGS. 5 to 6B, and 13, the light-emitting substrate 1 further includes a first insulating layer 50 disposed on a side of the first conductive pattern layer 30 away from the base 10. The first insulating layer 50 may be made of at least one of silicon oxynitride, silicon nitride or silicon oxide. The first insulating layer 50 may have a single-layer structure or a multi-layer structure. For example, the multi-layer structure may include a double-layer structure formed by stacking a silicon oxide layer and a silicon nitride layer.

For examples, referring to FIG. 6B, the first insulating layer 50 may include a first insulating sub-layer 50_1 (which may be referred to as a protective layer) and a second insulating sub-layer 50_2 that are stacked in a direction from the base 10 to the first conductive pattern layer 30. Materials of the first insulating sub-layer 50_1 and the second insulating sub-layer 50_2 may be different, and may each be selected from any one of silicon oxynitride, silicon nitride or silicon oxide. For example, the material of the first insulating sub-layer is silicon oxynitride, and the material of the second insulating sub-layer is silicon nitride.

As shown in FIGS. 5 to 6B, and 13, the light-emitting substrate 1 further includes a second conductive pattern layer 40 disposed on a side of the first conductive pattern layer 30 away from the base 10. For example, the light-emitting substrate 1 may be located on a side of the first insulating layer 50 away from the base 10. The first conductive pattern layer 30 and the second conductive pattern layer 40 are configured to form the signal lines in the driver circuit.

As shown in FIGS. 5, to 6B, the second conductive pattern layer 40 may include a plurality of lamp bead pads 42. Each lamp bead 20 in FIG. 2 is mounted on a lamp bead pad 42, and is electrically connected to the lamp bead pad 42. For example, each lamp bead pad 42 includes an anode pad P and a cathode pad N. A cathode (−) of a lamp bead 20 is electrically connected to a cathode pad N of a lamp bead pad 42, and an anode (+) of the lamp bead 20 is electrically connected to an anode pad P of the lamp bead pad 42. In some embodiments of the present disclosure, the cathode (−) and the anode (+) of the lamp bead 20 may be electrically connected to the lamp bead pad through a reflow soldering process. For example, a solder paste is formed on an upper surface of the second conductive pattern layer 40, and a gas at a certain temperature is made to flow to the light-emitting substrate 1 on which the lamp beads 20 have been placed, so that solder at pins of the lamp beads 20 is melted, and the melted solder is bonded to the lamp bead pads 42, thereby forming thousands of lamp beads 20 on the light-emitting substrate 1. In order to make the solder in a liquid state fully fill a position of a pin of each lamp bead 20 during the flow, a surface of the second conductive pattern layer 40 where the lamp bead pads 42 are located is required to be flat, so as to avoid inclination of the lamp beads 20 during reflow soldering, and in turn, to avoid problems that the lamp beads 20 are soldered insufficiently, and even light emitted by the light-emitting substrate 1 is uneven during the reflow soldering.

As shown in FIGS. 3 and 4, in the second conductive pattern layer 40, the plurality of lamp bead pads 42 includes a plurality of first lamp bead pads 42_1 and at least one second lamp bead pad 42_2. There may be one or a plurality of second lamp bead pads 42_2.

Referring to FIG. 5, a vertical projection (also referred to as an orthogonal projection) of each first lamp bead pad 42_1 on the base 10 at least partially overlaps with a vertical projection of a first signal line 31 on the base 10. In some possible implementations, the vertical projection of the first lamp bead pad 42_1 on the base 10 may be within the vertical projection of the first signal line 31 on the base 10. In this case, distances between any portions of the first lamp bead pad 42_1 and the base 10 are substantially the same. That is, a distance between any portion of the first lamp bead pad 42_1 and the base 10 are substantially the same, denoted by D1 in FIG. 5. In some other possible implementations, a vertical projection of a portion of the first lamp bead pad 42_1 on the base 10 may be within the vertical projection of the first signal line 31 on the base 10, and a vertical projection of a remaining part thereof on the base 10 may be outside the vertical projection of the first signal line 31 on the base 10. In this way, a distance between the portion of the first lamp bead pad 42_1 and the base 10 is denoted by D1. The distance refers to a vertical distance in a thickness direction of the base 10.

Referring to FIGS. 4, 6A and 6B, an orthogonal projection of each second lamp bead pad 42_2 on the base 10 is outside orthogonal projections of the plurality of first signal lines 31 (for example, which may be all first signal lines 31) in the first conductive pattern layer on the base 10. That is, there is no first signal line 31 under the second lamp bead pad 42_2, and D2 is a distance between a second lamp bead pad 42_2 and the base 10. The distance refers to a vertical distance in the thickness direction of the base 10.

In some embodiments of the present disclosure, D1 and D2 are substantially the same, so that flatness of a plane formed by the lamp bead pads may be ensured. For example, since during formation of a layer, there is a certain deviation in thicknesses of a same layer in different regions due to process accuracy and the like, there are inevitably process deviations in D1 and D2 in an actually obtained light-emitting substrate. For example, $|D1-D2|/D1 \leq x$, or, $|D1-D2|/D2 \leq x$, where x is, for example, 10%, 8% or 5%. For another example, D1 is equal to D2 (D1=D2). In this way, since the plane where the lamp bead pads 42 are located is flat, the lamp beads 20 in FIG. 2 will not be inclined during the reflow soldering, and in turn, it may be possible to avoid the problems that the lamp beads are soldered insufficiently, and even the light emitted by the light-emitting substrate 1 is uneven during the reflow soldering.

In addition, the second conductive pattern layer 40 may be made of at least one of copper, aluminum or silver. For a formation process of the second conductive pattern layer 40, reference may be made to the formation process of the first conductive pattern layer 30. In some embodiments, the materials of the first conductive pattern layer 30 and the second conductive pattern layer 40 may be the same or different. For example, the materials of the first conductive pattern layer 30 and the second conductive pattern layer 40 are the same. In this way, process steps such as changing a sputtering target material and changing a type of an etching solution may be reduced, and in turn, time may be saved, and a yield may be improved.

In some embodiments, as shown in FIG. 3, the second conductive pattern layer 40 further includes light-emitting driver pads 43 for mounting the light-emitting drivers 60 in FIG. 2, and a plurality of second signal lines 41. For example, some second signal lines 41 electrically connect first signal lines 31 to some lamp bead pads 42, some other second signal lines 41 electrically connect some other lamp bead pads 42 (i.e., connecting the some other lamp bead pads 42 in series), and yet some other second signal lines 41 electrically connect lamp bead pads 42 to light-emitting driver pads 43. In these embodiments, a group of lamp bead pads 42 connected in series through the second signal lines 41 is referred to as a pad group G42. For example, in FIG. 3, a pad group G42 includes at least two (e.g., four) lamp bead pads 42 distributed in an array.

In some embodiments of the present disclosure, as shown in FIGS. 5 to 6B, 13 and 15, the light-emitting substrate 1 further includes a second insulating layer 70, and the second insulating layer 70 is provided with a plurality of second via holes 42. A portion of the second conductive pattern layer 40 exposed by a second via hole 42 forms a lamp bead pad 42 or a light-emitting driver pad 43. In each lamp bead pad 42, the anode pad P is electrically connected to a second signal line 41, and the cathode pad N is electrically connected to another second signal line 41. For example, an anode pad P of a lamp bead pad 42 may be a portion of a second signal line 41 exposed by a second via hole H, and a cathode pad N of the lamp bead pad 42 may be a portion of another second signal line 41 exposed by a second via hole H.

For example, referring to FIG. 6A, the second insulating layer 70 may have a single-layer structure, and a material thereof is selected from any one of silicon oxynitride, silicon nitride or silicon oxide. For another example, referring to FIG. 6B, the second insulating layer 70 may include a third insulating sub-layer 70_1 (which may be referred to as a protective layer) and a fourth insulating sub-layer 70_2 that are stacked in the direction from the base to the first conductive pattern layer 30. The via holes in the third insulating sub-layer 70_1 define positions of the lamp bead pads and the light-emitting driver pads. The fourth insulating sub-layer 70_2 functions to support the lamp bead pads and the light-emitting driver pads. Materials of the third insulating sub-layer 70_1 and the fourth insulating sub-layer 70_2 may be different, and may each be selected from any one of silicon oxynitride, silicon nitride or silicon oxide. For example, the material of the third insulating sub-layer is silicon oxynitride, and the material of the fourth insulating sub-layer is silicon nitride. For example, the material of the third insulating sub-layer 70_1 may be the same as that of the first insulating sub-layer, and the material of the fourth insulating sub-layer 70_2 may be the same as that of the second insulating sub-layer.

In some embodiments of the present disclosure, as shown in FIGS. 5, 6A, 6B and 13, the light-emitting substrate 1 may further include a buffer layer 80 disposed on a side of the first conductive pattern layer 30 proximate to the base 10, and the buffer layer 80 functions to buffer the light-emitting substrate to avoid damage caused by collision. In addition, the buffer layer may be made of at least one of silicon nitride or silicon oxide.

Figure 7:
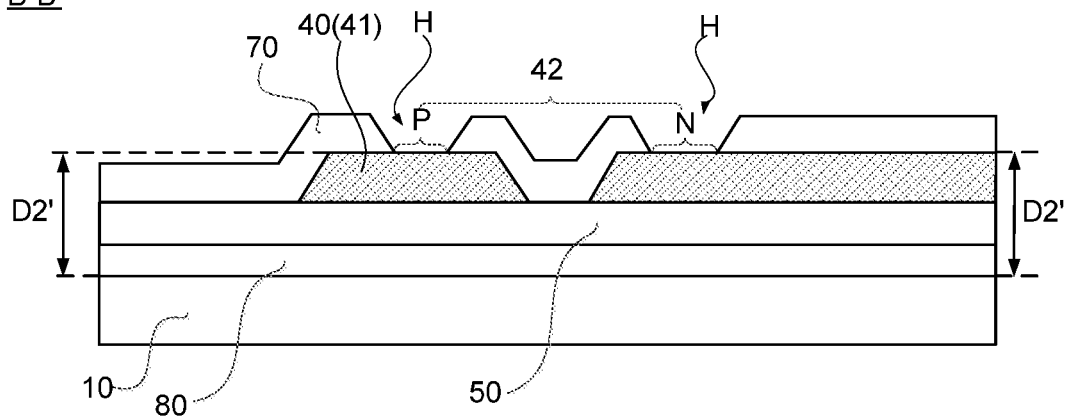
FIG. 7 is yet another sectional view of the light-emitting substrate taken along the line B-B' shown in FIG. 4.

In some embodiments of the present disclosure, as shown in FIGS. 6A and 6B, the first conductive pattern layer 30 further includes at least one (which may be one or a plurality of, e.g., a plurality of) spacer 32. Each spacer 32 is insulated from the plurality of first signal lines 31. As shown in FIGS. 4, 6A and 6B, a vertical projection of a second lamp bead pad 42_2 on the base 10 at least partially overlaps with a vertical projection of a spacer 32 on the base 10. For example, the vertical projection of the second lamp bead pad 42_2 on the base 10 is within the vertical projection of the spacer 32 on the base 10. That is, the second lamp bead pad 42_2 is directly above the spacer 32. In this way, the flatness of the plane formed by the lamp bead pads is significantly improved, and D1 and D2 are substantially the same. FIG. 7 is yet another sectional view of the light-emitting substrate 1 taken along the line B-B' shown in FIG. 4. In a case where the structure at BB' of the light-emitting substrate 1 shown in FIG. 4 adopts the structure shown in FIG. 7, as shown in FIG. 7, the light-emitting substrate 1 is not provided with a spacer on a side of the second lamp bead pad 42_2 proximate to the base 10, the distance between the second lamp bead pad 42_2 and the base 10 is denoted as D2'. However, as shown in FIG. 4, the first signal line 31 is further provided between the first lamp bead pad 42_1, which is provided in the same layer as the second lamp bead pad 42_2, and the base 10, which results in that the distance D2' between the second lamp bead pad 42_2 and the base 10 is smaller than the distance D1 between the first lamp bead pad 42_1 and the base 10, and in turn, results in a problem that a plane formed by lamp bead pads is uneven. In the embodiments of the present disclosure, the structure shown in FIG. 6A is adopted, that is, the spacer 32 is disposed on a side of the second bead pad 42_2 proximate to the base 10, so that the distances between bead pads 42 and the base 10 are equal, and the problem that the plane formed by bead pads is uneven is effectively improved. In addition, as shown in FIG. 4, the spacers 32 and the first signal lines 31 are arranged in a same layer, and they may be formed through a same patterning process in this case. Thus, processes may be simplified, and costs may be saved.

Figure 8:
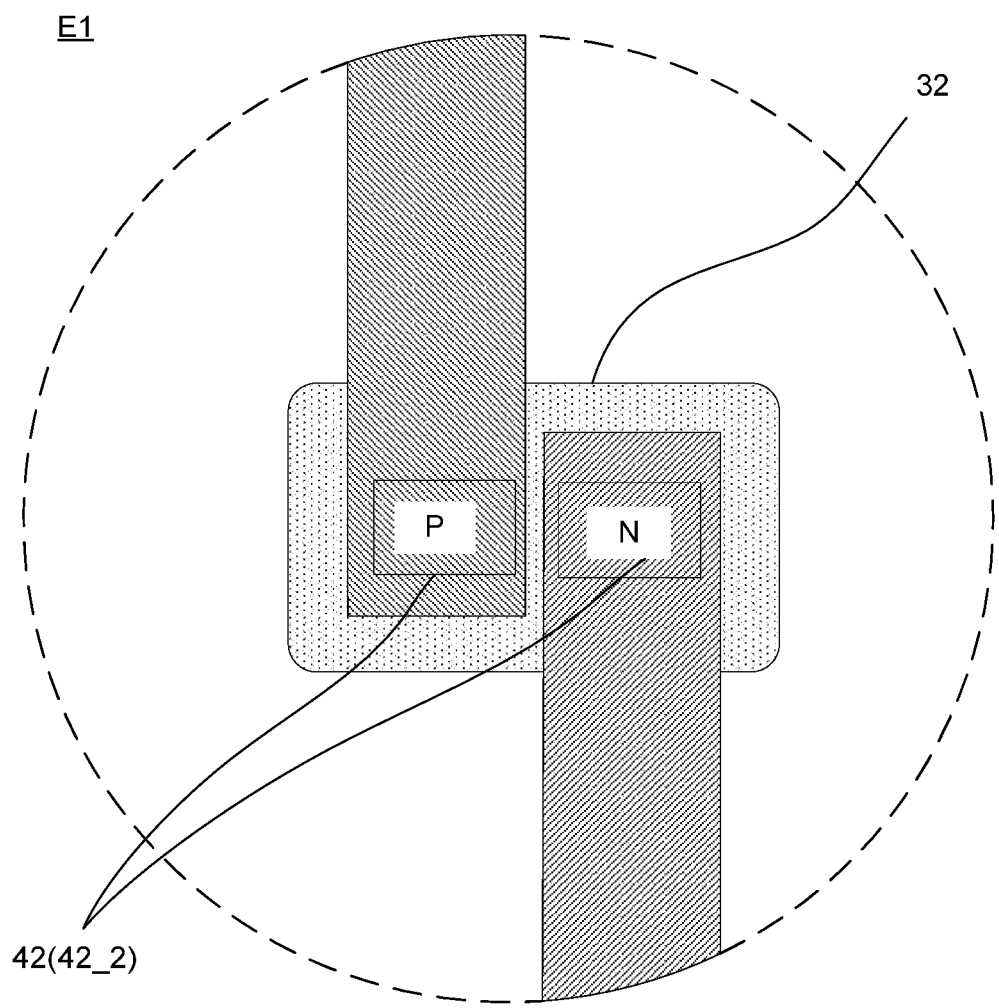
FIG. 8 is an enlarged view of the portion E1 in FIG. 4.

FIG. 8 is an enlarged view of the portion E1 in FIG. 4. In some embodiments, referring to FIG. 8, a spacer 32 is a pattern, and the pattern has a closed outline. Patterns hereinafter have a same meaning as the pattern herein, which will not be repeated. Vertical projections of an anode pad P and a cathode pad N in a second lamp bead pad 42_2 on the base 10 are both within a vertical projection of the pattern on the base 10.

In some possible implementations, referring to FIG. 4, in the light-emitting substrate 1, the number of the spacers 32 is equal to the number of the second lamp bead pads 42_2. For example, there are a plurality of spacers 32 and a plurality of second lamp bead pads 42_2. In this case, the plurality of second lamp bead pads 42_2 are arranged directly above the plurality of spacers 32 in one-to-one correspondence.

Figure 9:
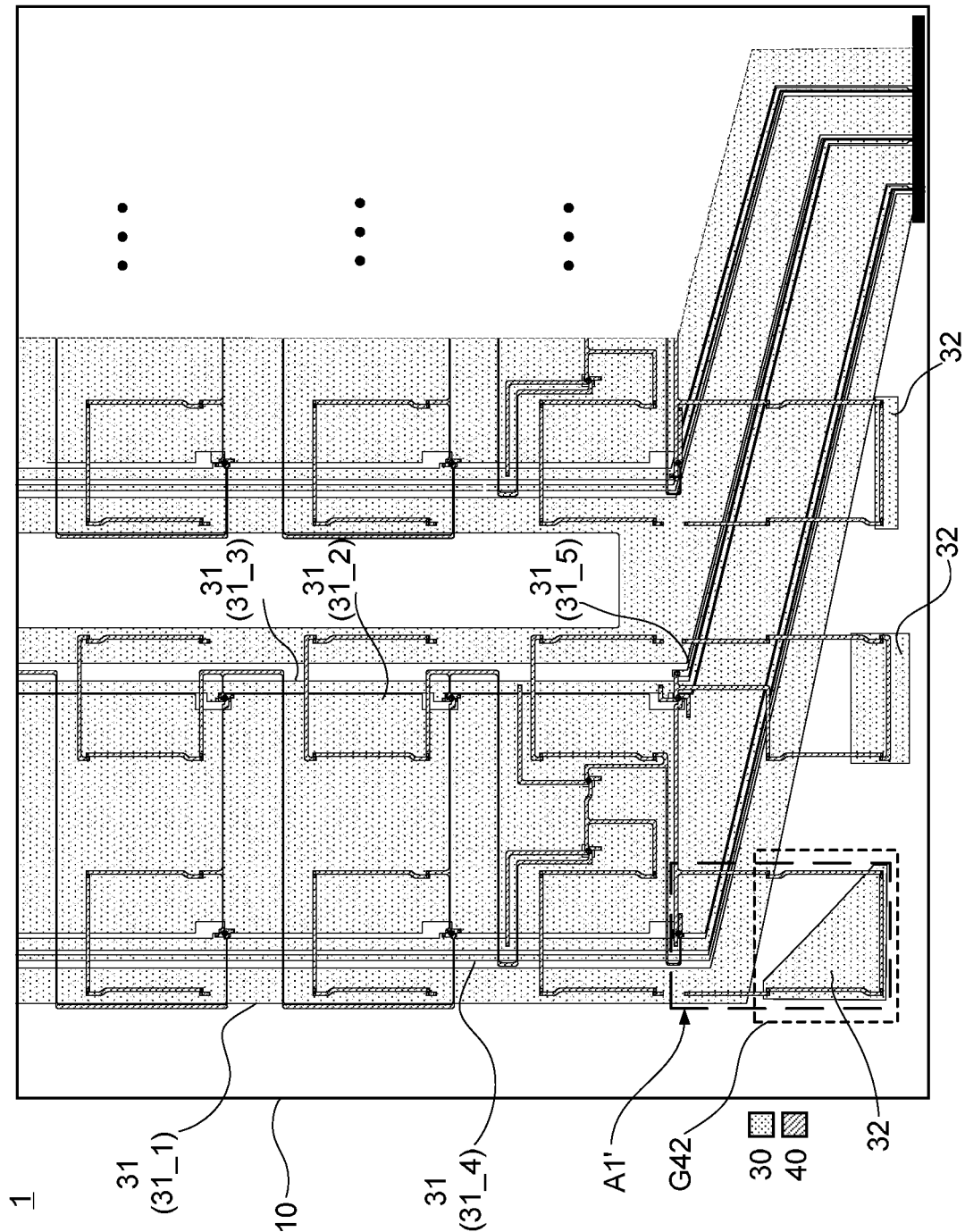
FIG. 9 is a local top view of another light-emitting substrate, in accordance with some embodiments of the present disclosure.
Figure 10:
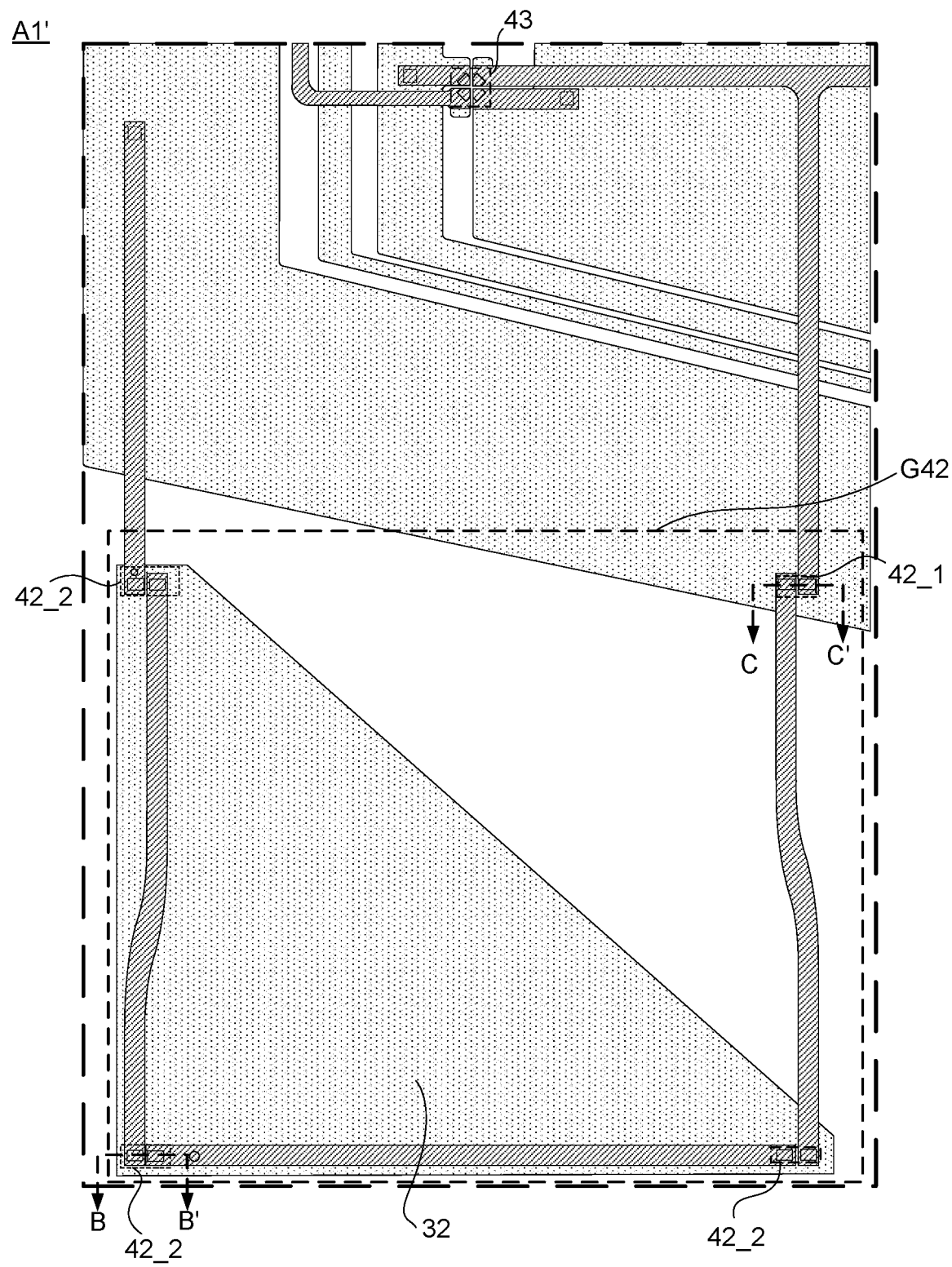
FIG. 10 is an enlarged view of the portion A1' in FIG. 9.
Figure 11:
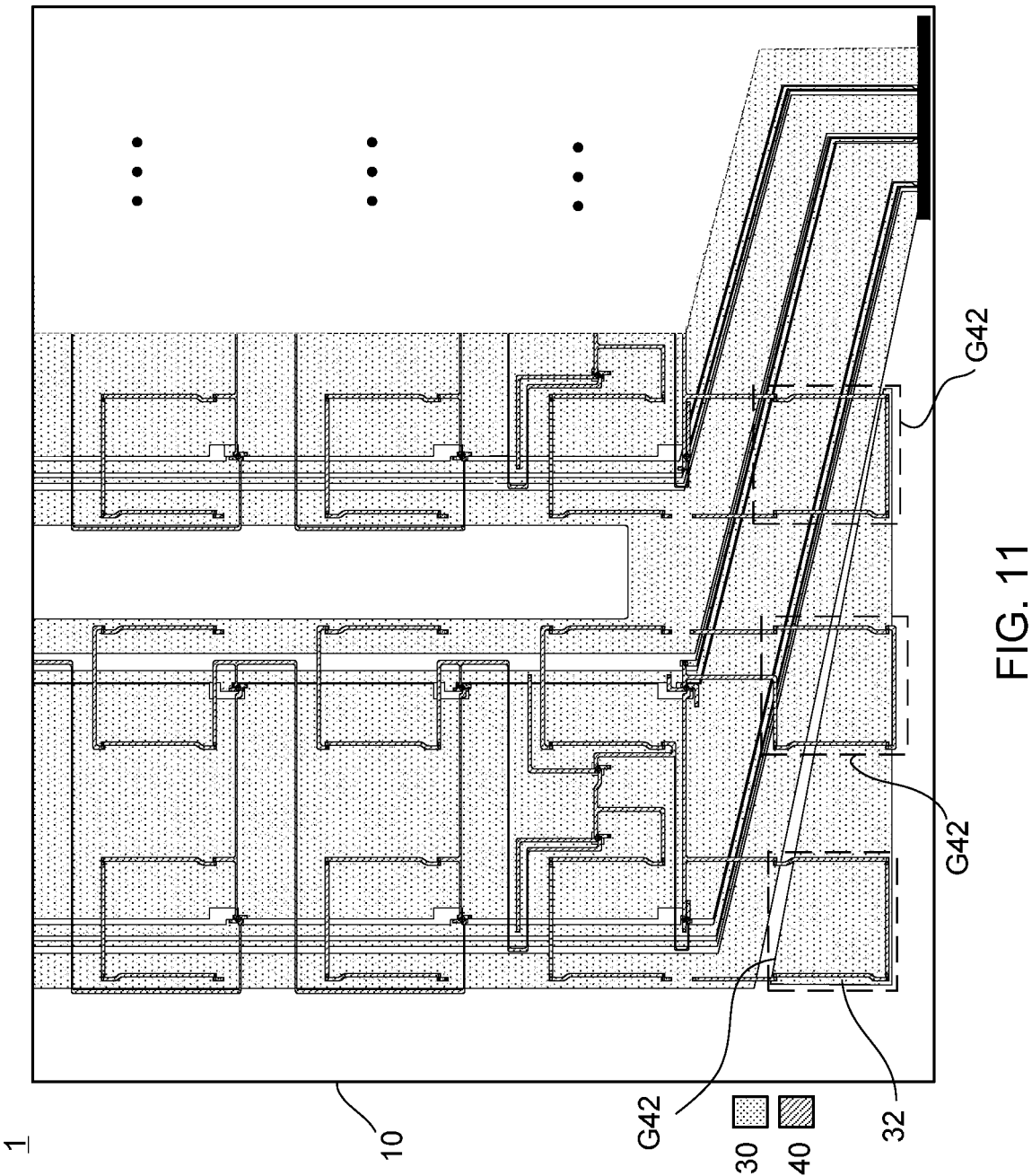
FIG. 11 is a local top view of yet another light-emitting substrate, in accordance with some embodiments of the present disclosure.

FIGS. 9 and 11 are each a local top view of another light-emitting substrate, in accordance with some embodiments of the present disclosure. FIG. 10 is an enlarged view of the portion A1' in FIG. 9. In some other possible implementations, referring to FIGS. 9, 10 and 11, a spacer 32 is a pattern. There are a plurality of second lamp bead pads 42_2, and the number of the second lamp bead pads 42_2 is greater than the number of the spacers 32. Vertical projections of at least two second lamp bead pads 42_2 on the base 10 are within a vertical projection of a same spacer 32 on the base 10. For example, in FIGS. 9, 10 and 11, a plurality of second lamp bead pads 42_2 are located above the same spacer 32. In this way, a plurality of lamp beads 20 in FIG. 2 may be arranged above the same spacer 32, which reduces process requirements and saves costs. For example, the spacer 32 may be formed through a photolithography process, and the spacer 32 is provided under the plurality of second lamp bead pads 42_2, which reduces requirements on a mask during an exposure process, and in turn reduces costs of an entire process.

For example, referring to FIGS. 9, 10 and 11, at least two second lamp bead pads 42_2 located above the same spacer 32 are connected in series. That is, in a pad group G42, at least two second lamp bead pads 42_2 are provided above the same spacer 32. For example, as shown in FIGS. 9 and 10, a spacer 32 is provided under a plurality of (e.g., three) second lamp bead pads 42_2 in a same pad group G42. In other words, the plurality of (e.g., three) second lamp bead pads 42_2 above the same spacer 32 may belong to the same pad group G42. For another example, as shown in FIG. 11, a spacer 32 is provided under a plurality of second lamp bead pads 42_2 in different pad groups G42. In other words, the second lamp bead pads 42_2 above the same spacer 32 belong to different pad groups G42.

In these embodiments, as an example, referring to FIGS. 6A and 6B, each second lamp bead pad 42_2 may be insulated from a spacer 32 under the second lamp bead pad 42_2.

Figure 12:
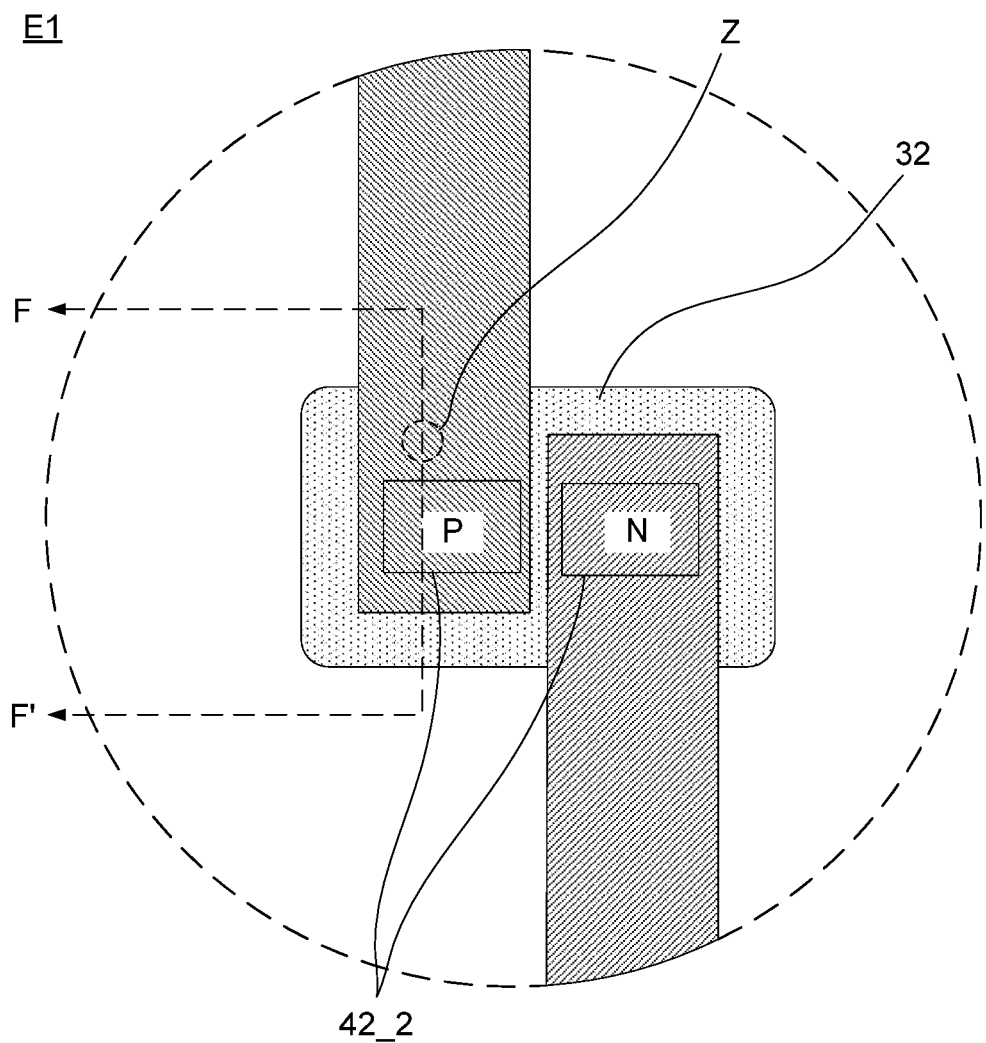
FIG. 12 is another top view of the portion E1 in FIG. 4.
Figure 13:
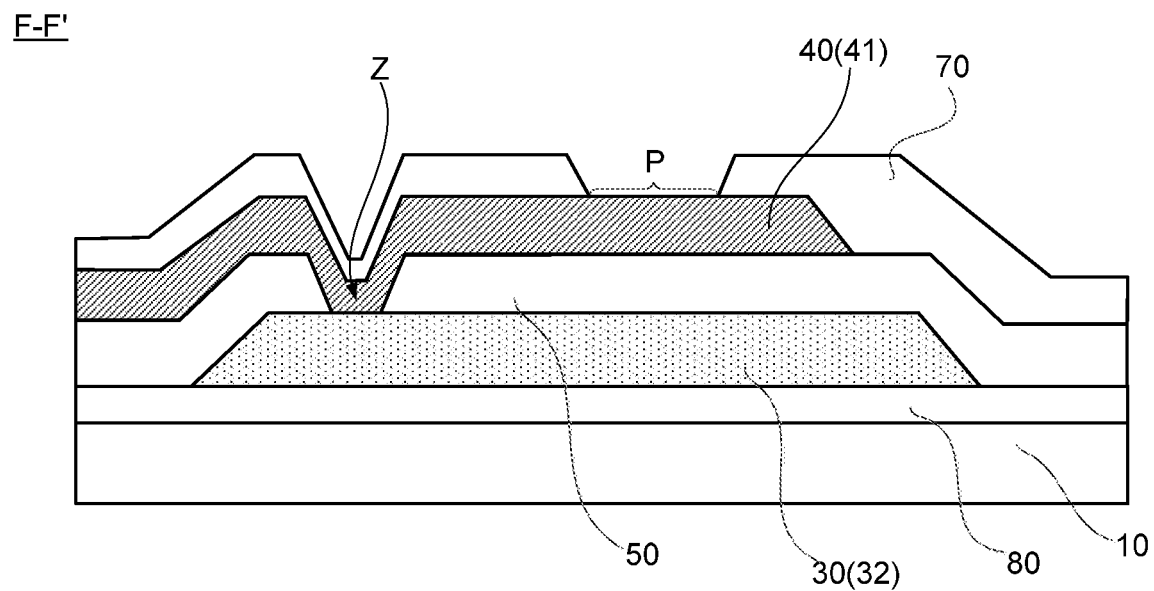
FIG. 13 is a sectional view of the light-emitting substrate taken along the line F-F' shown in FIG. 12.

In these embodiments, as another example, referring to FIGS. 12 and 13, an anode pad P or a cathode pad N of a second lamp bead pad 42_2 above a spacer 32 is electrically connected to the spacer 32. For example, if the second lamp bead pads 42_2 and the spacers 32 are arranged in one-to-one correspondence, an anode pad P or a cathode pad N of a (e.g., each) second lamp bead pad 42_2 may be electrically connected to a spacer 32 under the second lamp bead pad 42_2. For example, the anode pad P or the cathode pad N of the second lamp bead pad 42_2 may be electrically connected to the spacer 32 through at least one (e.g., one or a plurality of) first via hole Z in the first insulating layer 50. For another example, FIG. 10 shows three second lamp bead pads 42_2 connected in series above a spacer 32. In this case, an anode pad P or a cathode pad N of one of the second lamp bead pads 42_2 may be electrically connected to the spacer 32 through at least one first via hole Z in the first insulating layer 50.

Since the spacer 32 is located in the first conductive pattern layer 30, and may be made of a metal material, when the spacer 32 is electrically connected to a cathode pad N or an anode pad P of a second lamp bead pad 42_2, it is equivalent to reducing an equivalent resistance of the cathode pad N or the anode pad P of the second lamp bead pad 42_2, thereby increasing a current flowing through a lamp bead 20 mounted on the second lamp bead pad 42_2, and increasing brightness of the lamp bead 20.

Figure 14:
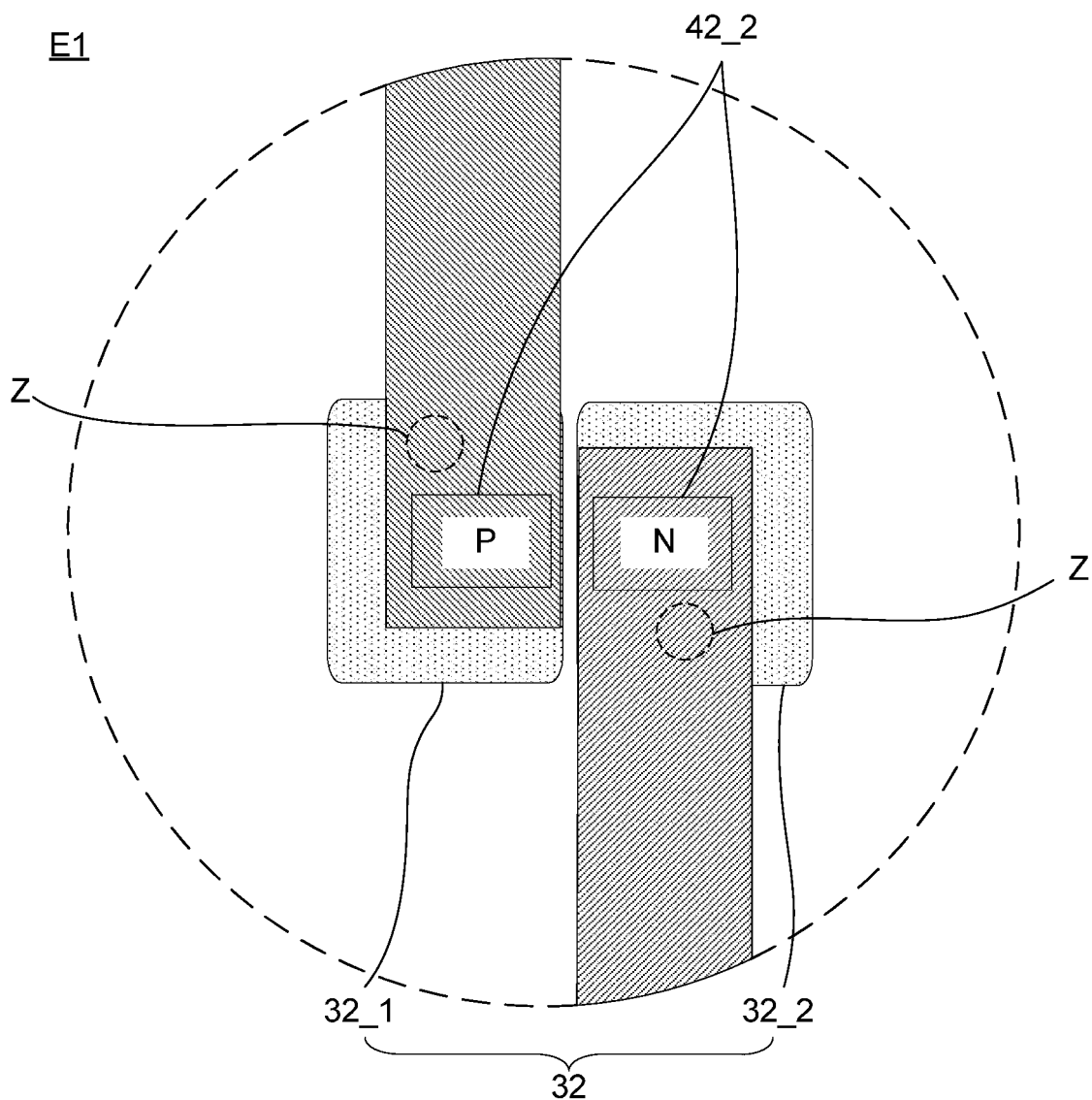
FIG. 14 is another top view of the portion E1 in FIG. 4.

FIG. 14 is another top view of the portion E1 in FIG. 4. In some other embodiments, referring to FIG. 14, a spacer 32 includes a first pattern 32_1 and a second pattern 32_2 arranged at an interval. A vertical projection of an anode pad P of a second lamp bead pad 42_2 on the base 10 is within a vertical projection of the first pattern 32_1 on the base 10. A vertical projection of a cathode pad N of the second lamp bead pad 42_2 on the base 10 is within a vertical projection of the second pattern 32_2 on the base 10.

In some possible implementations, referring to FIGS. 4 and 14, in the light-emitting substrate 1, the number of the spacers 32 is equal to the number of the second lamp bead pads 42_2. For example, there are a plurality of spacers 32 and a plurality of second lamp bead pads 42_2. In this case, the anode pad P of each second lamp bead pad 42_2 is located directly above a first pattern 32_1 in a spacer 32, and the cathode pad N of the second lamp bead pad 42_2 is located directly above a second pattern 32_2 in the spacer 32.

In these embodiments, as an example, each second lamp bead pad 42_2 is insulated from a spacer 32 under the second lamp bead pad.

In these embodiments, as another example, in FIG. 14, an anode pad P of a second lamp bead pad 42_2 may be electrically connected to a first pattern 32_1 in a spacer 32 under the second lamp bead pad 42_2, and a cathode pad N of the second lamp bead pad 42_2 may be electrically connected to a second pattern 32_2 in the spacer 32.

The embodiments of the present disclosure do not limit a shape of the spacer 32. For example, as shown in FIGS. 6 and 7, a longitudinal section of the spacer 32 may have a trapezoidal shape. For another example, the longitudinal section of the spacer 32 may have a rectangular shape. The longitudinal section herein refers to a plane parallel to the thickness direction of the base 10.

Similarly, the embodiments of the present disclosure do not limit a thickness of the spacer 32. For example, the thickness of each spacer 32 is substantially the same as a thickness of any first signal line 31. Herein, the thickness of the spacer 32 is a dimension of the spacer 32 in a direction parallel to the thickness direction of the base 10.

Figure 15:
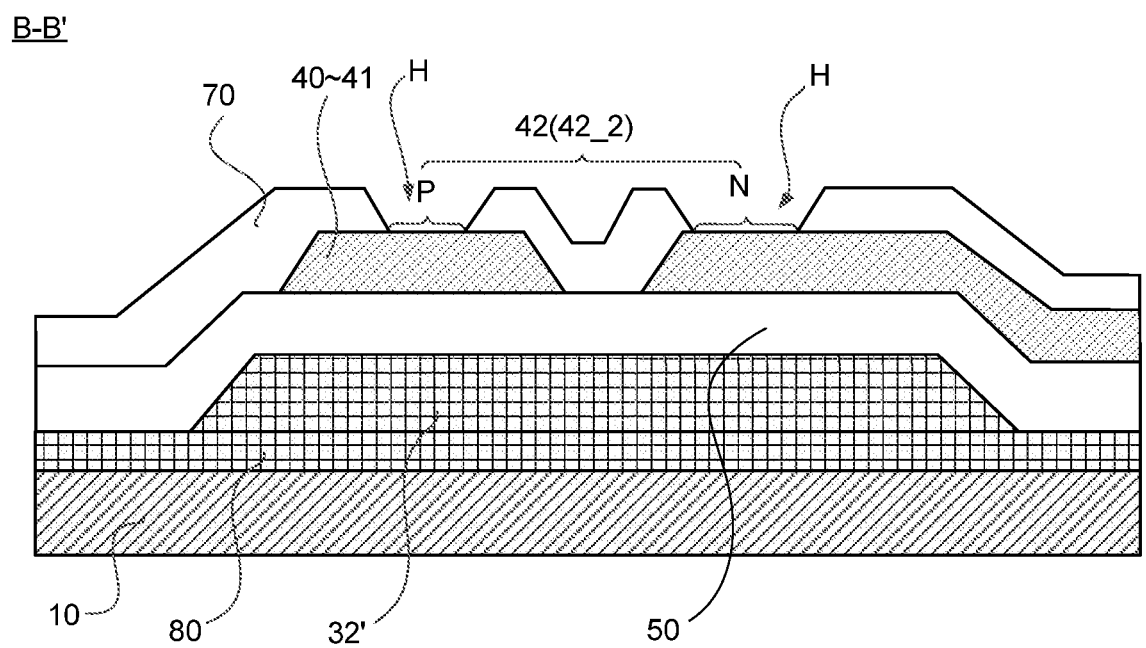
FIG. 15 is yet another sectional view of the light-emitting substrate taken along the line B-B' shown in FIG. 4.

In some other embodiments of the present disclosure, as shown in FIG. 15, in order to make a distance between a first lamp bead pad 42_1 and the base 10 the same as a distance between a second lamp bead pad 42_2 and the base 10, the light-emitting substrate 1 may include at least one insulating spacer 32'. A thickness of the insulating spacer 32' is the same as the thickness of the first signal line 31, and a vertical projection of a second lamp bead pad 42_2 on the base 10 is within a vertical projection of the insulating spacer 32' on the base 10. In some examples, each insulating spacer 32' is located between the base 10 and the first insulating layer 50. For example, each insulating spacer 32' is located between the buffer layer 80 and the first insulating layer 50. The insulating spacer 32' may be in contact with an upper surface of the buffer layer 80. For example, a material of the insulating spacer 32' may be the same as that of the buffer layer 80. In this case, the insulating spacer 32' and the buffer layer 80 may form an integral structure. For another example, the material of the insulating spacer 32' may be different from that of the buffer layer 80. Similarly, in this way, it may also be possible to avoid the phenomenon of insufficient soldering when the lamp bead is mounted on the second lamp bead pad 42_2.

Figure 16A:
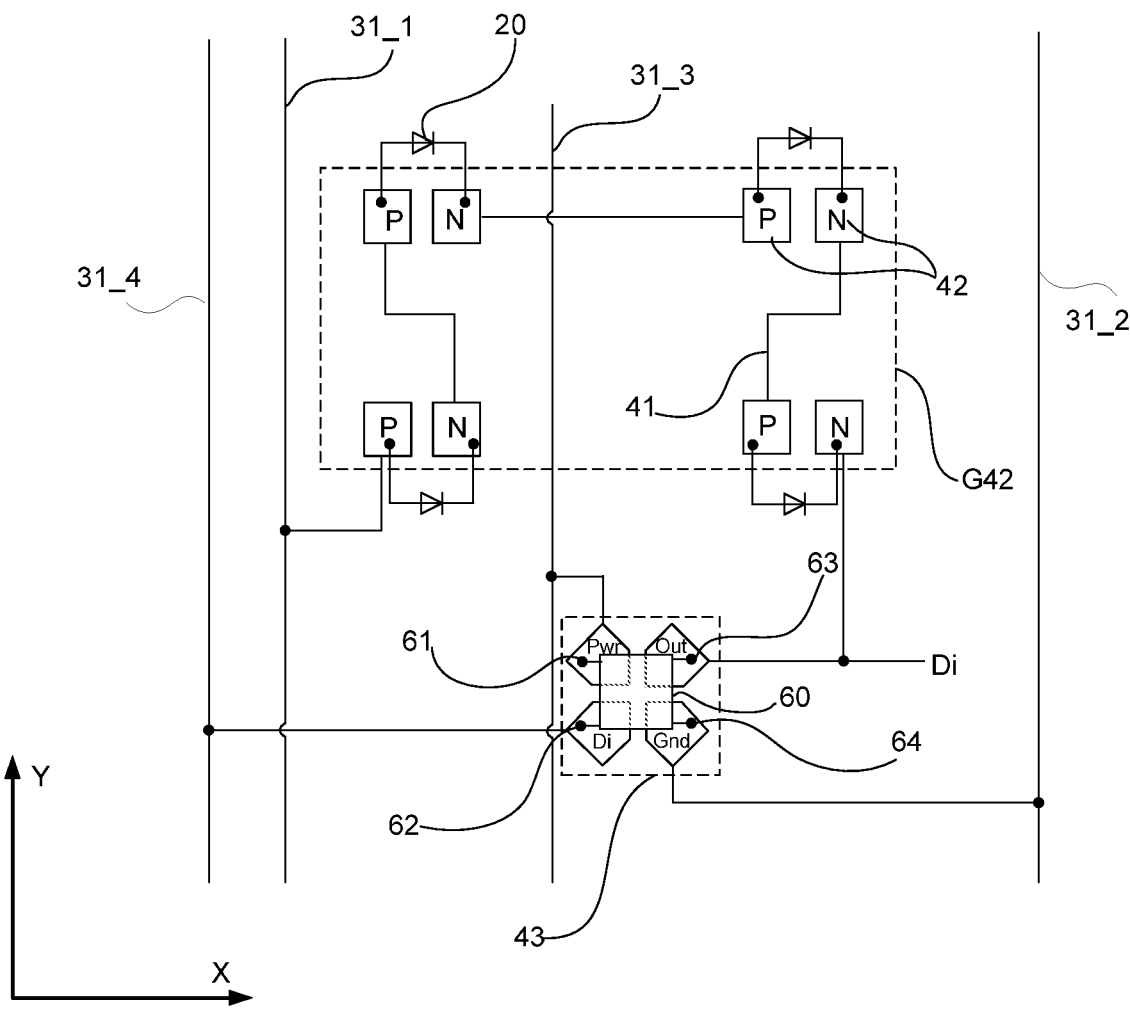
FIG. 16A is a connection diagram among components included in a light-emitting unit, in accordance with some embodiments of the present disclosure.
Figure 16B:
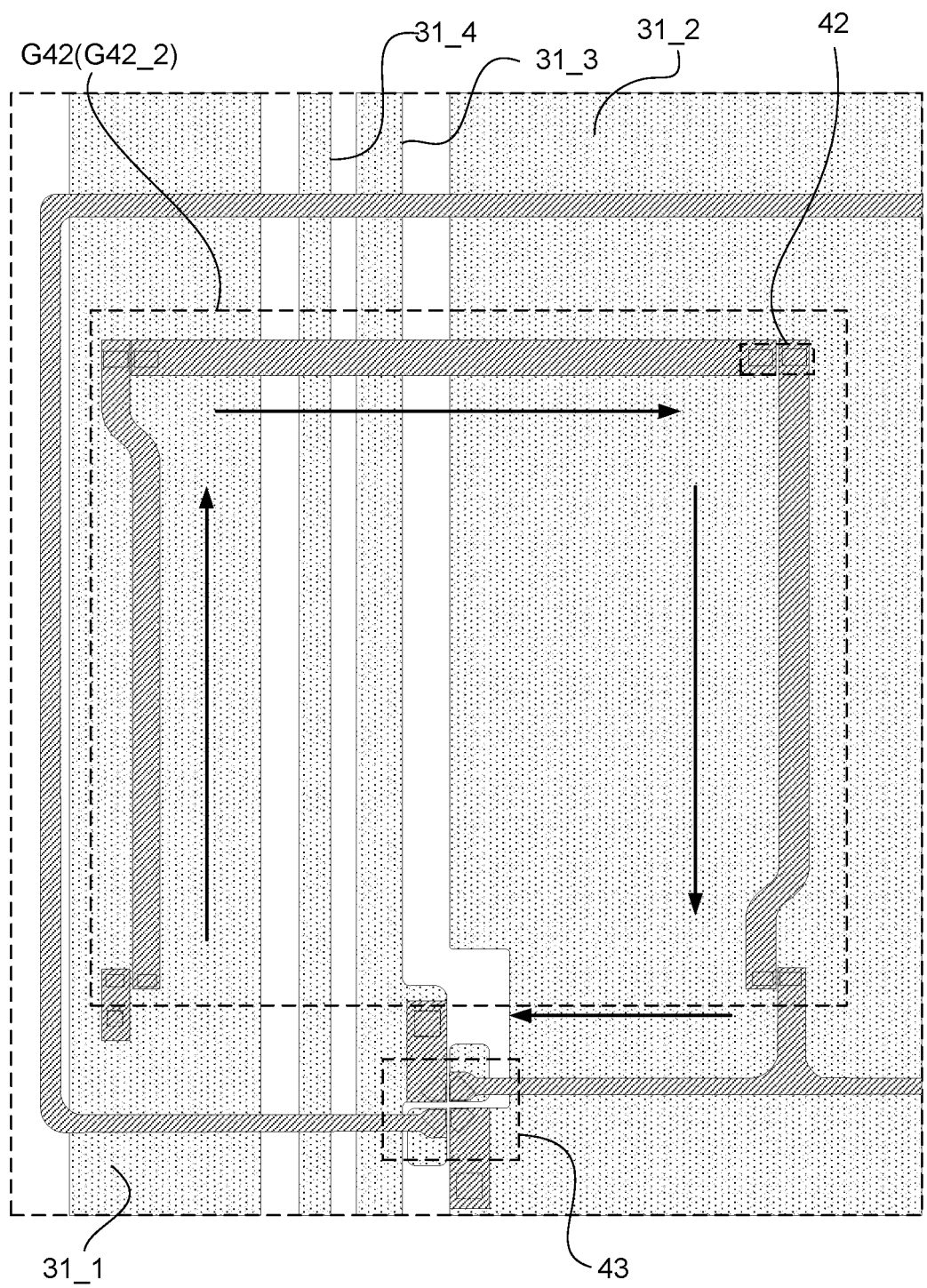
FIG. 16B is a top view of a light-emitting unit, in accordance with some embodiments of the present disclosure.
Figure 17:
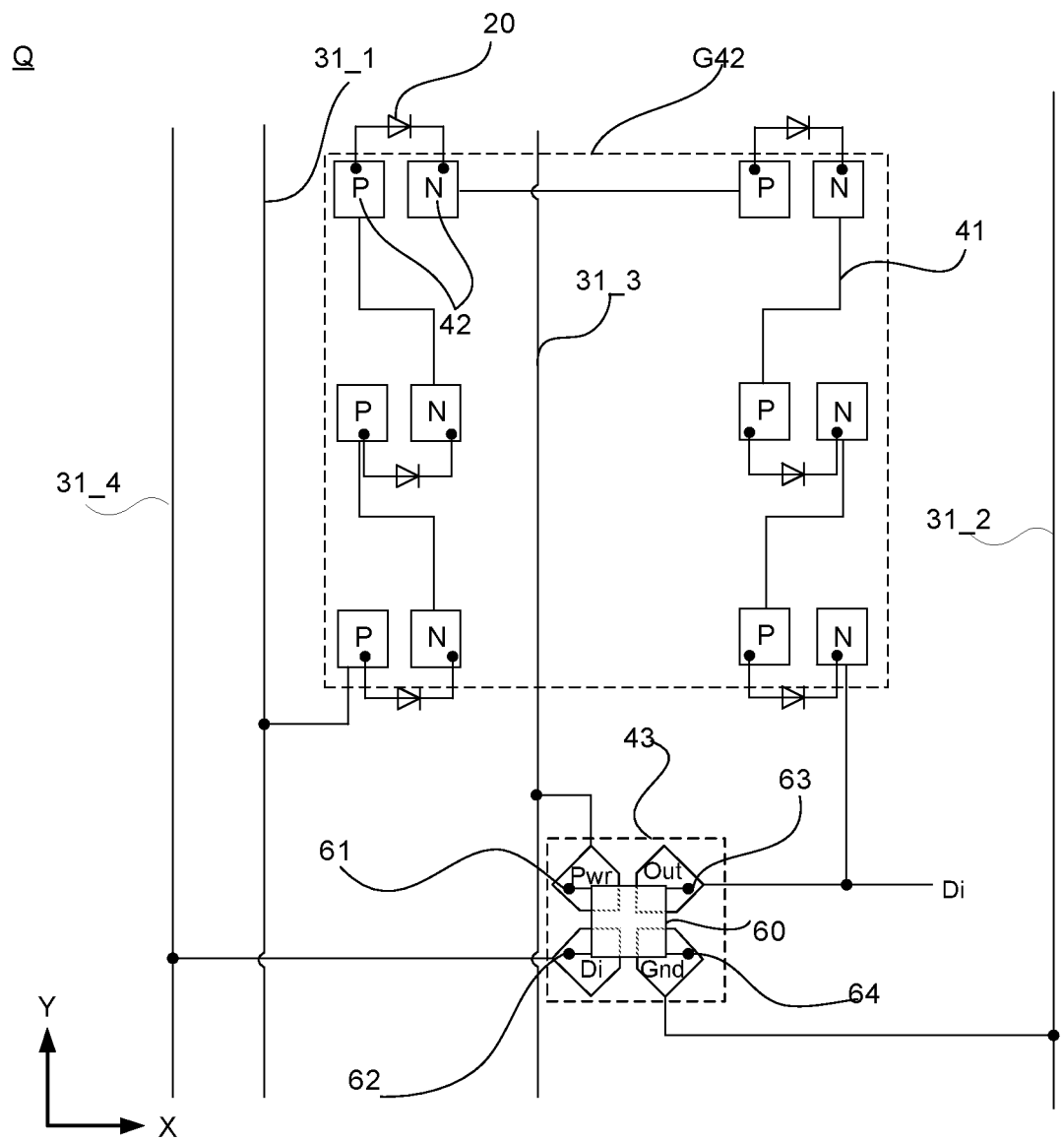
FIG. 17 is another connection diagram among components included on a light-emitting unit, in accordance with some embodiments of the present disclosure.

Hereinafter, FIG. 16A is a connection diagram among components included in a light-emitting unit, in accordance with some embodiments of the present disclosure. FIG. 16B is a top view of a light-emitting unit, in accordance with some embodiments of the present disclosure. FIG. 17 is another connection diagram among components included in a light-emitting unit, in accordance with some embodiments of the present disclosure. Referring to FIGS. 2, 16A, 16B and 17, a connection relationship between the lamp beads 20 and the light-emitting driver 60 that are included in the light-emitting unit Q and the driver circuit in the above embodiments will be described in detail.

In some embodiments, as shown in FIGS. 2, 16A to 17, the plurality of first signal lines 31 in the first conductive pattern layer 30 may include at least one (e.g., a plurality of) driving voltage line 31_1 (which may also be referred to as a first power supply line), and may further include at least one (e.g., a plurality of) common voltage line 31_2 (which may also be referred to as a ground line) and at least one (e.g., a plurality of) source voltage line 31_3 (which may also be referred to as a second power supply line); furthermore, the plurality of first signal lines 31 may further include at least one (e.g., a plurality of) source address line 31_4 (which may also be referred to as a control line); in addition, the plurality of first signal lines 31 may further include at least one (e.g., a plurality of) feedback line 31_5. A driving voltage line 31_1 may be electrically connected to at least two bonding pins BP, a common voltage line 31_2 may be electrically connected to at least two bonding pins BP, a source voltage line 31_3 may be electrically connected to a bonding pin BP, a source address line 31_4 may be electrically connected to a bonding pin BP, and a feedback line 31_5 may be electrically connected to a bonding pin BP. In addition, first signal lines 31 of different types are insulated from each other. For example, the driving voltage line 31_1 and the source address line 31_4 are insulated from each other.

As shown in FIGS. 16A, 16B and 17, the light-emitting substrate 1 further includes a plurality of light-emitting driver pads 43. The plurality of lamp bead pads 42 in the light-emitting substrate 1 are divided into a plurality of pad groups G42. The plurality of pad groups G42 may be arranged in a matrix. For example, they are arranged in an S×K array with S rows and K columns in a first direction X and a second direction Y, where S is an integer greater than 0, and K is an integer greater than 0. For example, S is greater than or equal to 2, and K is greater than or equal to 2 (S≥2, and K≥2). The first direction X intersects with the second direction Y, for example, the first direction X is perpendicular to the second direction Y. Correspondingly, the plurality of lamp beads 20 in the light-emitting substrate 1 are divided into a plurality of lamp bead groups G20, and lamp beads 20 in each lamp bead group G20 are correspondingly mounted on lamp bead pads 42 in a pad group G42. Therefore, an arrangement of the lamp bead groups G20 (as shown in FIG. 2) is the same as the arrangement of the pad groups G42.

The plurality of pad groups G42 may also be arranged in other ways. In some other embodiments of the present disclosure, a plurality of pad groups G42 (e.g., some or all of the pad groups G42) are not limited to being arranged in a straight line, and may also be arranged in a curve, in a loop, or in any other way, which may be determined according to actual needs, and is not limited in the embodiments of the present disclosure. In addition, the number of the pad groups G42 may be determined according to actual needs. For example, it may be determined according to a size of the light-emitting substrate 1 and a required brightness, which is not limited in the embodiments of the present disclosure.

As shown in FIGS. 16A, 16B and 17, each pad group G42 is composed of lamp bead pads 42 connected in series. Both terminals of each pad group G42 are electrically connected to a driving voltage line 31_1 and a light-emitting driver pad 43. For example, in each pad group G42, an anode pad P at a terminal is electrically connected to the driving voltage line 31_1, and a cathode pad N at the other terminal is electrically connected to the light-emitting driver pad 43.

In some embodiments of the present disclosure, a pad group G42 includes at least two (e.g., four in FIG. 16A, and six in FIG. 17) lamp bead pads 42 connected in series. Each lamp bead pad 42 includes an anode pad P and a cathode pad N, and cathode pads N and anode pads P of the plurality of lamp bead pads 42 are connected in series end to end in sequence. The lamp bead pads 42 are electrically connected in sequence through a plurality of second signal lines 41, so that the lamp bead pads 42 are connected in series in a pad group G42. For example, any two adjacent lamp bead pads G42 are electrically connected through a second signal line 41. As shown in FIGS. 16A, 16B and 17, In each pad group G42, an anode pad P of a first lamp bead pad 42 is electrically connected to a driving voltage line 31_1, and a cathode pad N of a last lamp bead pad 42 is connected to an output pin 63 of a light-emitting driver 60. Since a cathode (−) and an anode (+) of a lamp bead are electrically connected to a cathode pad N and an anode pad P of a lamp bead pad 42 respectively, a signal transmission path is formed among lamp beads 20 mounted on lamp bead pads 42 in a pad group G42, that is, the lamp beads 20 are connected in series to constitute a lamp bead group G20.

In some other embodiments of the present disclosure, as shown in FIG. 16A, each pad group G42 has four lamp bead pads 42 connected in series. A plurality of second signal lines 41 may be used to connect two adjacent lamp bead pads 42 in a same pad group G42 in series. Each lamp bead pad 42 includes an anode pad P and a cathode pad N, and the cathode pads N and the anode pads P of the plurality of lamp bead pads 42 are connected in series end to end in sequence. Working principles of the pad group G42 including four lamp bead pads 42 and a light-emitting driver 60 electrically connected to the pad group G42 are the same as working principles of a pad group G42 including six lamp bead pads 42 and a light-emitting driver 60 electrically connected to the pad group G42, and details will not be repeated herein.

For example, in a pad group G42, a length of a second signal line between any two adjacent lamp bead pads 42 is substantially the same, so that a resistance of the second signal line is balanced, and in turn, load balance may be improved, and stability of a circuit may be improved.

In the above embodiments, the description is made by taking examples in which a pad group G42 includes four or six lamp bead pads 42. In a case where four or six lamp bead pads are used, a shadow phenomenon of the light-emitting substrate may be effectively avoided. It will be noted that, there may also be other number of lamp bead pads 42 in a pad group G42 in the present disclosure, such as five, seven, eight or any other number, which is not limited. The plurality of lamp bead pads 42 may be arranged in any way. For example, they are arranged according to a required pattern, and are not limited to being arranged in a matrix. The number of the pad groups G42 may be determined according to actual needs, for example, it may be determined according to the size of the light-emitting substrate 1 and the required brightness. Based on this, a design of the spacer 32 is substantially the same as the design of the spacer 32 in the above embodiments, and details will not be repeated herein.

In some embodiments of the present disclosure, the second signal lines 41 are arranged in a same layer as the first lamp bead pads 42_1 and the second lamp bead pad(s) 42_2, and they all disposed in the second conductive pattern layer 40. A light-emitting driver pad 43 (e.g., each light-emitting driver pad 43) is configured to mount a light-emitting driver 60, and to be electrically connected to the light-emitting driver 60. For example, as shown in FIGS. 16A, 16B and 17, the light-emitting driver 60 includes a first input pin 61, an output pin 63, and a common voltage pin 64. Correspondingly, the light-emitting driver pad 43 includes a first input pad Pwr, an output pad Out, and a common voltage pad Gnd that are electrically connected to the pins of the light-emitting driver. In addition, the light-emitting driver 60 may further include a second input pin 62. Correspondingly, the light-emitting driver pad 43 further includes a second input pad Di electrically connected thereto.

The second input pad Di is configured to receive a second input signal, which is, for example, an address signal for gating a light-emitting driver 60 at a corresponding address. The light-emitting driver 60 is mounted on the light-emitting driver pad 43. For example, addresses of different light-emitting drivers 60 may be the same or different. The second input signal may be an 8-bit address signal, and the light-emitting driver 60 mounted on the light-emitting driver pad 43 may resolve the address signal to obtain an address to be transmitted.

The first input pad Pwr is configured to receive a first input signal, which is, for example, a power line carrier communication signal. For example, the first input signal not only provides power to the light-emitting driver 60 mounted on the light-emitting driver pad 43, but also transmits communication data to the light-emitting driver 60. The communication data may be used to control a light-emitting duration of a corresponding light-emitting unit Q, thereby controlling a visual brightness thereof.

The output pad Out is configured to output a driving signal and a relay signal. For example, the relay signal is an address signal provided to another light-emitting driver 60. That is, a second input pad Di of the another light-emitting driver receives the relay signal as a second input signal, thereby obtaining an address signal. For another example, the driving signal may be a driving current for driving the lamp beads 20 mounted on the light-emitting unit Q to emit light.

The common voltage pad Gnd is configured to receive a common voltage signal, such as a ground signal.

In this case, the light-emitting driver 60 mounted on the light-emitting driver pad 43 is configured to output a relay signal through the output pad Out according to the second input signal received by the second input pad Di and the first input signal received by the first input pad Pwr in a first period, and to provide driving signals through the output pad Out to the plurality of lamp beads sequentially connected in series in a second period. For example, in the first period, the output pad Out outputs a relay signal, and the relay signal is provided to another light-emitting driver 60, so that the another light-emitting driver 60 obtains an address signal. In the second period, the output pad Out outputs a driving signal, and the driving signal is provided to the plurality of lamp beads 20 sequentially connected in series, so that the lamp beads 20 emit light in the second period. It will be understood that, the first period and the second period are different periods, and the first period may be, for example, earlier than the second period. The first period may be consecutive to the second period, and an end time of the first period is a start time of the second period. Alternatively, there may be other period(s) between the first period and the second period, which may be used to achieve other required function(s). The other period(s) may be used only to separate the first period and the second period, so as to prevent the signals output through the output pad Out in the first period and the second period from interfering with each other.

Hereinafter, a connection relationship between both a light-emitting driver pad 43 and a corresponding light-emitting driver 60 and the plurality of first signal lines will be described.

Both a first input pad Pwr of a (e.g., each) light-emitting driver pad 43 and a first input pin 61 of a corresponding light-emitting driver 60 are electrically connected to a source voltage line 31_3. The source voltage line 31_3 is configured to transmit a first input signal. For example, each source voltage line 31_3 is electrically connected to at least one light-emitting unit Q (one or a plurality of light-emitting units, e.g., a column of light-emitting units), and provides the first input signal to first input pin(s) 61 of the light-emitting unit(s) electrically connected thereto.

Both a common voltage pin 64 of a (e.g., each) light-emitting driver 60 and a common voltage pad Gnd of a corresponding light-emitting driver pad 43 are electrically connected to a common voltage line 31_2. The common voltage line 31_2 is configured to transmit a common voltage. For example, each common voltage line 31_2 is electrically connected to at least one light-emitting unit Q (one or a plurality of light-emitting units, e.g., a column of light-emitting units), and provides the common voltage to common voltage pin(s) 64 of the light-emitting unit(s) electrically connected thereto. The common voltage is, for example, a ground signal.

Both an output pin 63 of a (e.g., each) light-emitting driver 60 and an output pad Out of a corresponding light-emitting driver pad 43 are electrically connected to a pad group G42. For example, both an output pin 63 of a (e.g., each) light-emitting driver 60 and an output pad Out of a corresponding light-emitting driver pad 43 are electrically connected to a cathode pad N at a terminal of the pad group G42 (i.e., a cathode pad N of a last lamp bead pad 42 in the pad group G42 in an order from a driving voltage line 31_1 to the light-emitting driver pad 43), so as to output driving signals to the lamp beads 20 connected in series that are mounted in the light-emitting unit Q.

The driving voltage line 31_1 is configured to transmit a driving voltage. For example, each driving voltage line 31_1 is electrically connected to at least one light-emitting unit Q (one or more light-emitting units, e.g., a column of light-emitting units). For example, the driving voltage line 31_1 is electrically connected to positive electrode(s) at terminal (s) of at least one lamp bead group G20. That is, it is electrically connected to anode pad(s) P at terminal(s) of at least one pad group G42, so as to provide the driving voltage to the light-emitting unit(s) electrically connected thereto.

In this way, by using a pad group G42 electrically connected to a light-emitting driver 60 to control brightnesses of lamp beads 20 in a corresponding lamp bead group G20, the brightnesses of the lamp beads 20 may simultaneously reach a preset brightness value.

In some embodiments, as shown in FIGS. 2 and 3, in all light-emitting driver pads 43, at least two (a part of or all) light-emitting driver pads 43 are connected in a cascade manner. Correspondingly, in all light-emitting drivers 60, at least two (a part of or all) light-emitting drivers 60 are connected in a cascade manner. For example, in FIG. 2, at least two columns (e.g., two columns) of light-emitting drivers 60 are connected in the cascade manner.

As shown in FIG. 2, in the cascaded light-emitting drivers 60, a second input pin 62 of a first-stage light-emitting driver F60 is electrically connected to a source address line 31_4. The source address line 31 is configured to transmit a second input signal. Except the first-stage light-emitting driver F60, an output pin 63 of a present-stage light-emitting driver 60 is electrically connected to a second input pin 62 of a next-stage light-emitting driver, and an output pin 63 of a last-stage light-emitting driver L60 is electrically connected to a feedback line 31_5. The feedback line 31_5 extends to the bonding region B, and is electrically connected to at least one bonding pin BP in the bonding region B, and is finally electrically connected to a driver chips mounted in the bonding region B.

The light-emitting drivers 60 are located in gaps in an array formed by the plurality of lamp bead pads 42. Positions of the light-emitting drivers 60 are not limited, and may each be arranged in any gap between the lamp bead pads 42. The positions of the light-emitting drivers 60 may be determined according to actual needs, and are not limited in the embodiments of the present disclosure.

Hereinafter, positions of the first lamp bead pads 42_1 and the second lamp bead pad(s) 42_2 will be described by taking an example in which the light-emitting substrate 1 is applied to a display apparatus.

Figure 18:
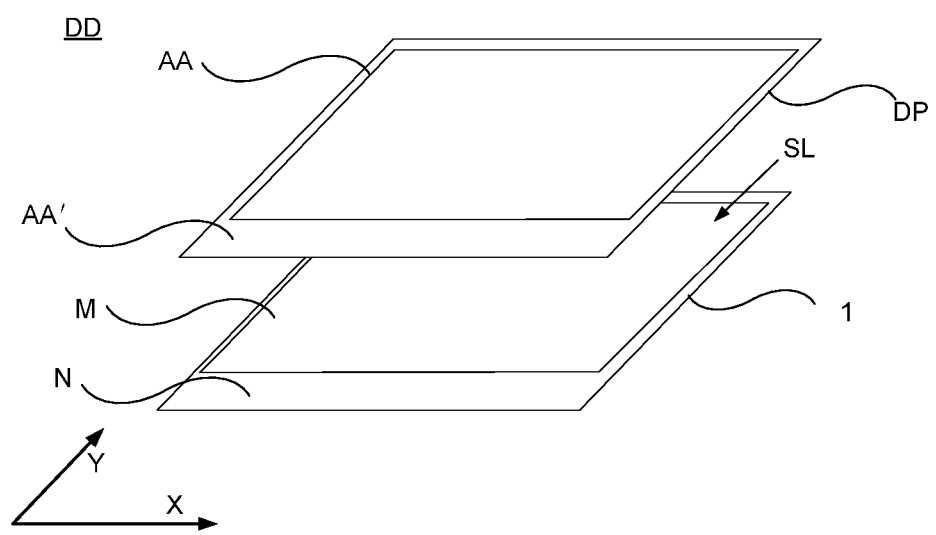
FIG. 18 is an exploded view of a display apparatus, in accordance with some embodiments of the present disclosure.
Figure 19:
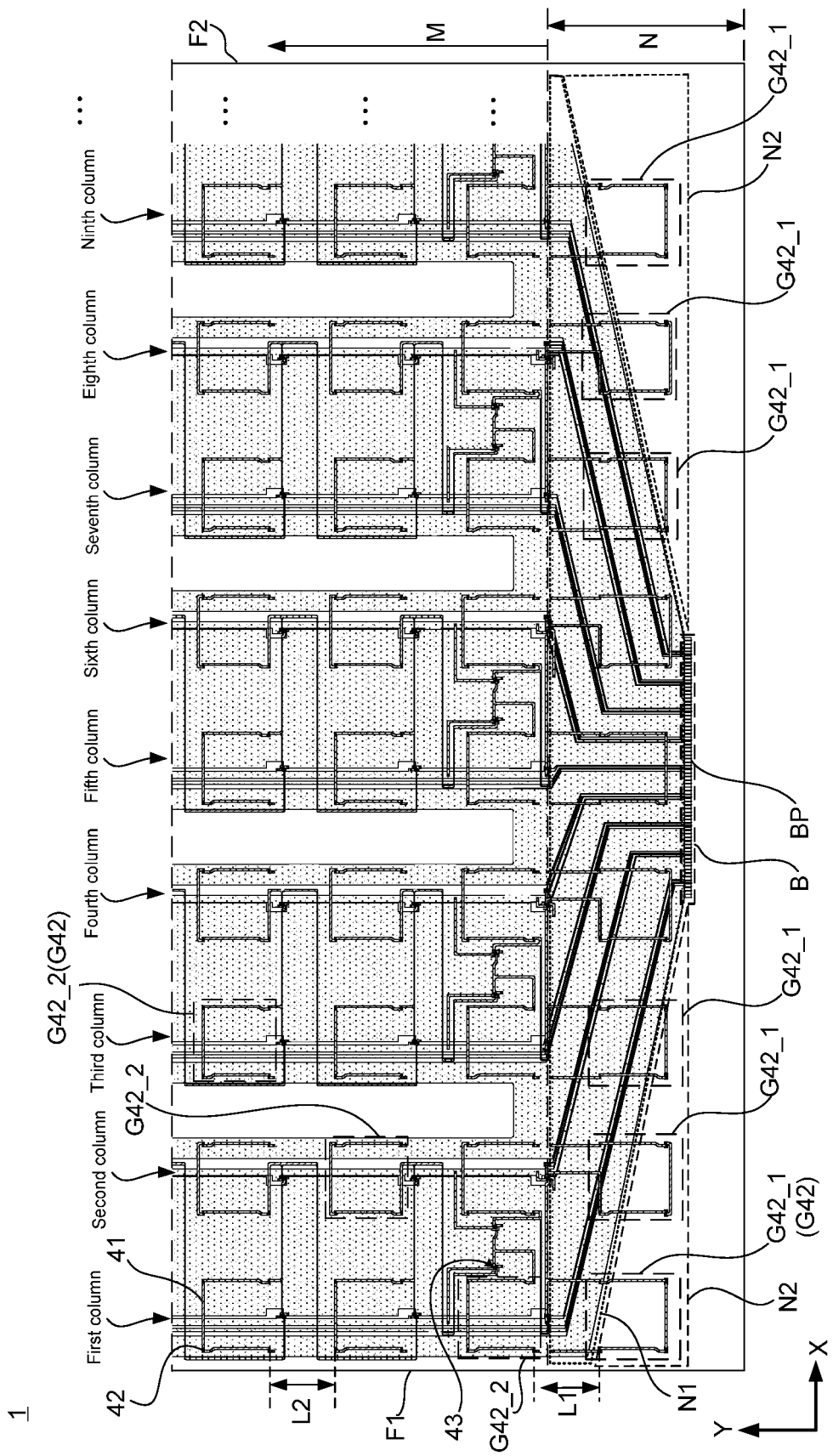
FIG. 19 is a top view of a light-emitting substrate, in accordance with some embodiments of the present disclosure.

FIG. 18 is an exploded view of a display apparatus, in accordance with some embodiments of the present disclosure. Referring to FIG. 18, it can be seen from the above that, the display apparatus DD includes the light-emitting substrate 1 and the display panel DP disposed on a light-exit side LS of the light-emitting substrate 1. The display panel DP has an active area (AA) for displaying images, and a non-active area AA' around the active area AA. The light-emitting substrate 1 has two edges (a first edge F1 and a second edge F2 as shown in FIG. 19) opposite to each other in the first direction X, and an effective light-emitting region M and a fan-out region (which may also be referred to as an oblique wiring region) N that are located between the two edges and are distributed in the second direction Y. The first direction X intersects with the second direction Y. For example, an orthogonal projection of the active area AA of the display panel on the light-emitting substrate 1 may be within the effective light-emitting region M of the light-emitting substrate 1.

FIG. 19 is a top view of a light-emitting substrate, in accordance with some embodiments of the present disclosure. Referring to FIG. 19, in order to make the light-emitting substrate 1 provide uniform light to the display panel DP, in some embodiments of the present disclosure, the light-emitting substrate 1 is provided with a plurality of lamp bead pads 42 not only in the effective light-emitting region M, in which at least some (e.g., all) lamp bead pads 42 are each provided with a lamp bead 20, and is to provided with a plurality of lamp bead pads 42 but also in the fan-out region N (a boundary between the effective light-emitting region M and the fan-out region N being a line parallel to the first direction X where a point where a first signal line is bent first is located), in which at least some (e.g., all) lamp bead pads 42 are each provided with a lamp bead 20.

In addition, in order to control the lamp beads 20, the fan-out region N includes a bonding region B, and the light-emitting substrate 1 is provided with a plurality of bonding pins BP in the bonding region B. In the light-emitting substrate 1, each first signal line 31 extends in the effective light-emitting region M and the fan-out region N, and extends to the bonding region B, and is electrically connected to at least one bonding pin BP in the bonding region B, and is finally bonded and connected to a driver chip. A plurality of different first signal lines 31 are electrically connected to different bonding pins B to receive voltage signals provided by the driver chip bonded to these bonding pins BP.

Figure 20:
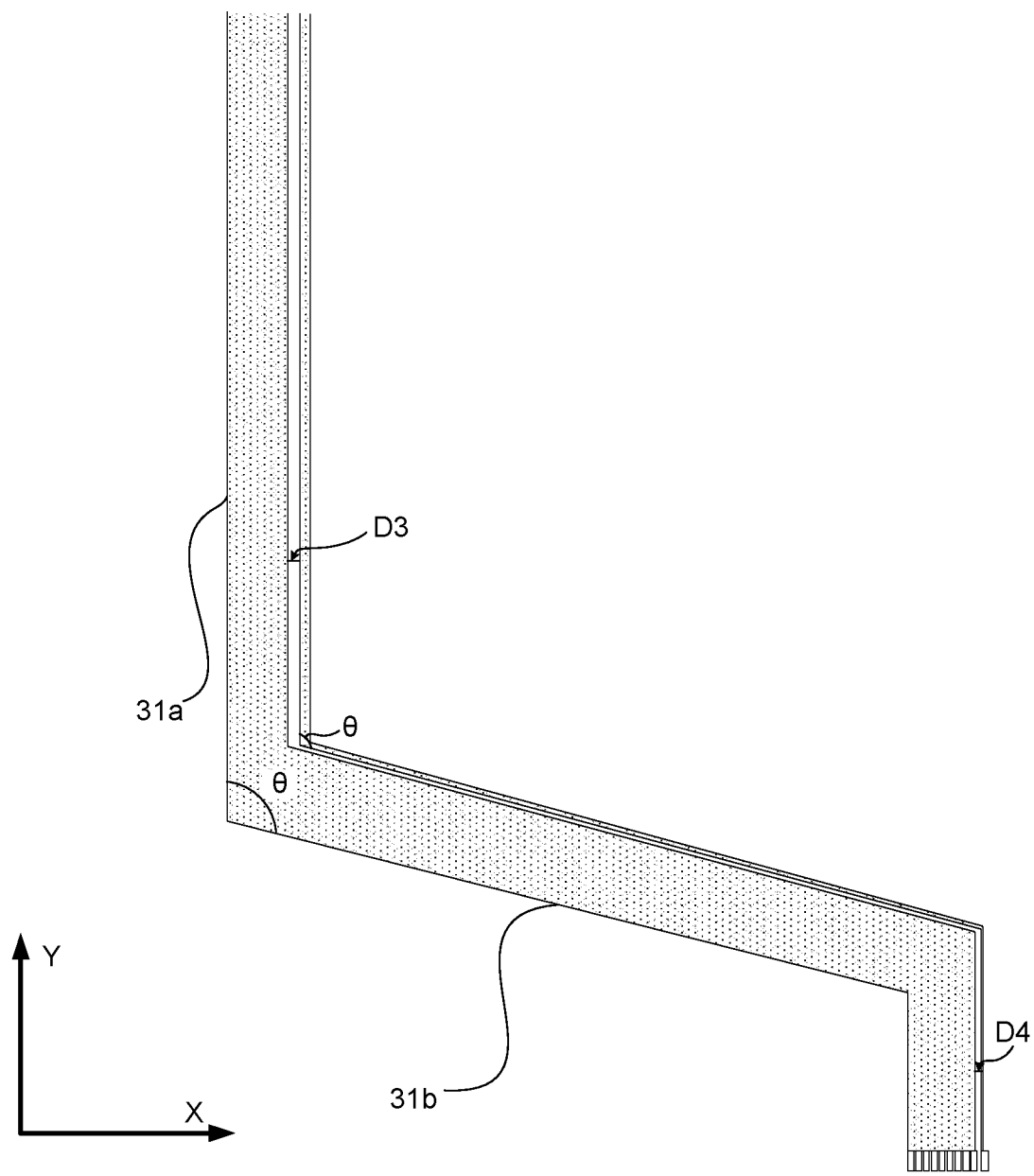
FIG. 20 is a local top view of a first signal line in a light-emitting substrate, in accordance with some embodiments of the present disclosure.

The bonding region B occupies a limited space of the light-emitting substrate 1 in the first direction X, and a width of each bonding pin BP is not of a same order of magnitude as a width of at least one first signal line 31 in the effective light-emitting region M. Moreover, compared with the width of each bonding pin BP, a distance between two adjacent bonding pins BP in the plurality of bonding pins BP is smaller. Therefore, most or all first signal lines 31 cannot extend completely in a straight line. For example, FIG. 20 is a local top view of a first signal line in a light-emitting substrate, in accordance with some embodiments of the present disclosure. As shown in FIG. 20, in at least two first signal lines 31, each first signal line 31 may include a first portion 31a and a second portion 31b. There is an included angle θ between the first portion 31a and the second portion 31b, and the second portion 31b is located in the fan-out region N. A distance D4 between ends of second portions 31b of two adjacent first signal lines 31 that are away from first portions 31a is smaller than a distance D3 between the first portions 31a of the two adjacent first signal lines 31. Therefore, space occupied by the plurality of first signal lines 31 in the first direction X is narrowed within the bounding region.

Based on this, at least one second lamp bead pad 42_2 (which may be all or some second lamp bead pads) is provided in a region outside a region occupied by the plurality of (e.g., all) first signal lines 31 in the fan-out region N. For example, the fan-out region N may include at least one first sub-region N1 and at least one second sub-region N2. The first sub-region(s) N1 are region(s) occupied by the second portions 31b of the first signal lines 31. That is, the second portion 31b of each first signal line 31 is provided in a first sub-region N1. Moreover, each first sub-region N1 and each second sub-region N2 are alternately distributed in the first direction X. For example, as shown in FIG. 19, the fan-out region N may include one first sub-region N1 and two second sub-regions N2. The second portions 31b of all of the first signal lines 31 are located in the first sub-region N1, a region of the fan-out region N outside the first sub-region N1 and is closer to the first edge F1 of the light-emitting substrate 1 is referred to as a second sub-region N2, and a region of the fan-out region N outside the first sub-region N1 and is closer to the second edge F2 of the light-emitting substrate 1 is referred to as the other second sub-region N2. For another example, the fan-out region N may include W (W being greater than or equal to 2 (W≥2)) first sub-regions N1 and W+1 second sub-regions N2. In the first direction X, a region of the fan-out region N outside all the first sub-regions N1 and is closest to the first edge F1 of the light-emitting substrate 1 is referred to as a second sub-region N2, a region of the fan-out region N outside all the first sub-regions N1 and is closest to the second edge F2 of the light-emitting substrate 1 is referred to as another second sub-region N2, and each remaining second sub-region N2 is located between two adjacent first sub-regions N1. Based on this, the light-emitting substrate 1 is provided with at least one second lamp bead pad 42_2 in a second sub-region N2. In this way, it may be possible to ensure that light provided by the lamp beads 20 in the effective light-emitting region M and the lamp beads 20 in the fan-out region N in the light-emitting substrate 1 is still received under an interface between the active area AA and the non-active area AA'. As a result, brightness of light at the interface between the active area AA and the non-active area AA' is the same or substantially the same as brightness of light in the active area AA, and the purpose of providing the uniform light may be achieved.

In some embodiments of the present disclosure, referring to FIG. 19, the plurality of pad groups G42 in the light-emitting substrate 1 includes at least one first pad group G42_1. In these embodiments, a pad group G42 including second lamp bead pad(s) 42_2 is referred to as a first pad group G42_1. The light-emitting substrate 1 shown in FIG. 19 includes six first pad groups G42_1. For example, a (e.g., each) first pad group G42_1 includes at least one first lamp bead pad 42_1 and at least one second lamp bead pad 42_2 that are connected in series. For example, the six first pad groups G42_1 all belong to this type of first pad groups G42_1. For example, in the first pad group G42_1, each second lamp bead pad 42_2 may be located in the fan-out region N, and all or some first lamp bead pads 42_1 may also be located in the fan-out region N. For another example, the first pad group G42_1 includes at least two second lamp bead pads 42_2 connected in series. For example, the first pad group G42_1 may include four second lamp bead pads 42_2, and includes no first lamp bead pad 42_1.

In some embodiments of the present disclosure, in all first pad groups G42_1, at least one (e.g., one, a plurality of, or all) first pad group G42_1 is located in the fan-out region N. Referring to FIG. 4, for a first pad group G42_1 in the fan-out region N, lamp bead pads 42 included therein are located in the fan-out region N, and compared with a light-emitting driver pad 43 electrically connected to the first pad group, the first pad group G42_1 is away from the effective light-emitting region. In this way, in a case where a distribution density of the pad groups is uniform, a width of the fan-out region N of the light-emitting substrate 1 in the second direction Y may be reduced, which facilitates to meet a design requirement of the display apparatus for a narrow bezel; furthermore, the light-emitting driver pad may be closer to signal lines electrically connected thereto, and there is no need to add new connection lines, which reduces complexity of wiring.

In some embodiments of the present disclosure, referring to FIG. 19, in the light-emitting substrate 1, the plurality of pad groups G42 further includes a plurality of second pad groups G42_2, and a plurality of second pad groups G42_2 and one first pad group G42_1 are located in a same column in the second direction Y. For example, each second pad group G42_2 may include first lamp bead pads 42_1 connected in series, and includes no second lamp bead pad 42_2.

For example, as shown in FIG. 19, in a first column, one first pad group G42_1 is provided, and the rest are referred to as second pad groups G42_2. FIG. 4 shows a structure of a first pad group G42_1 in FIG. 19. Referring to FIGS. 19 and 4, in a first pad group G42_1, in an order from a driving voltage line 31_1 to a light-emitting driver pad 43 (as indicated by a direction indicated by the arrows), a second lamp bead pad 42 is farther away from a plurality of second pad groups G42_2 in a column where the first pad group G42_1 is located than a first lamp bead pad 42. That is, the second lamp bead pad 42 is closer to the second edge F2 in FIG. 19 than the first lamp bead pad 42. FIG. 16B shows a structure of a second pad group G42_2 in FIG. 19. Referring to FIGS. 19 and 16B, in a second pad group, in an order from a driving voltage line 31_1 to a light-emitting driver pad 43 (as indicated by a direction indicated by the arrow), a second lamp bead pad 42 is farther away from a first pad group G42_1 than a first lamp bead pad 42. That is, the second lamp bead pad 42 is farther away from the second edge F2 in FIG. 19 than the first lamp bead pad 42. In this case, lamp bead pads 42 in the first pad group G42_1 are arranged counterclockwise in the order from the driving voltage line 31_1 to the light-emitting driver pad 43, and lamp bead pads 42 in the second pad group G42_2 are arranged clockwise in the order from the driving voltage line 31_1 to the light-emitting driver pad 43.

For another example, in a second column, one first pad group G42_1 is provided, and the rest are referred to as second pad groups G42_2. Lamp bead pads 42 in the first pad group G42_1 are arranged clockwise in the order from the driving voltage line 31_1 to the light-emitting driver pad 43, and lamp bead pads 42 in a second pad group G42_2 are arranged counterclockwise in the order from the driving voltage line 31_1 to the light-emitting driver pad 43.

Based on the above connection method, lengths of a second signal line 41 connecting the first pad group G42_1 and the driving voltage line 31_1 and a second signal line 41 connecting the first pad group G42_1 and the light-emitting driver pad 43 may be reduced, thereby reducing the complexity of the wiring.

In some embodiments of the present disclosure, as shown in FIG. 19, for a column including a first pad group G42_1 in the light-emitting substrate 1, for example, for the first column, a first distance L1 is a distance between a second pad group G42_2 and an adjacent first pad group G42_1, and a second distance L2 is a distance between two adjacent second pad groups G42_2 in the second direction. The first distance L1 and the second distance L2 are substantially the same (meaning of being substantially the same has been explained above and will not be repeated herein). For example, for each column in the light-emitting substrate 1, a distance between any two adjacent pad groups is the same. In this way, distribution of pad groups in the column is uniform, and the brightness of the light emitted by the light-emitting substrate is also uniform.

In some embodiments of the present disclosure, with continued reference to FIGS. 19 and 3, and FIG. 3 may be considered an enlarged partial view of FIG. 19, for a column including a first pad group G42_1 in the light-emitting substrate, for example, for the first column, a light-emitting driver pad 43 electrically connected to a second pad group G42_2 adjacent to the first pad group G42_1 is located on a side of the second pad group G42_2 in the first direction X. In this way, in FIG. 19, on a right side of the second pad group G42_2, a sufficient space is left for arrangement of a light-emitting driver pad 43 electrically connected to the first pad group G42_1.

The above embodiments are described by taking an example in which all the second lamp bead pads 42_2 are provided in the fan-out region N. Correspondingly, the lamp bead pads 42 in the effective light-emitting region M are all first lamp bead pads 42_1. In some other embodiments of the present disclosure, some lamp bead pads 42 in the effective light-emitting region M may be first lamp bead pads 42_1, that is, they are located above the first signal lines 31; the remaining lamp bead pads 42 are second lamp bead pads 42_2, that is, they are located above the spacer(s) 32. For example, in the effective light-emitting region M, in all or some pad groups G42, each pad group G42 includes both the first lamp bead pad(s) 42_1 and the second lamp bead pad(s) 42_2. For arrangement of the spacer 32 in the effective light-emitting region M, reference may be made to the above embodiments, and details will not be repeated herein.

The foregoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A light-emitting substrate, comprising:
a base;
a first conductive pattern layer disposed on the base, the first conductive pattern layer including a plurality of first signal lines; and
a second conductive pattern layer disposed on a side of the first conductive pattern layer away from the base, wherein the second conductive pattern layer includes a plurality of lamp bead pads, and the plurality of lamp bead pads include a plurality of first lamp bead pads and at least one second lamp bead pad; a vertical projection of each first lamp bead pad on the base at least partially overlaps with a vertical projection of a first signal line on the base; a vertical projection of each second lamp bead pad on the base is outside vertical projections of the plurality of first signal lines on the base;
a distance between a first lamp bead pad and the base is substantially the same as a distance between a second lamp bead pad and the base;
the light-emitting substrate has two edges opposite to each other in a first direction, and an effective light-emitting region and a fan-out region that are located between the two edges and distributed in a second direction, the first signal line includes a first portion and a second portion, the second portion is located in the fan-out region, there is an included angle between the first portion and the second portion, a distance between ends of second portions of two adjacent first signal lines that are away from first portions is smaller than a distance between the first portions of the two adjacent first signal lines, the fan-out region includes at least one first sub-region and at least one second sub-region; the second portion of each first signal line is provided in the first sub-region, at least one second lamp bead pad is provided in the second sub-region.

2. The light-emitting substrate according to claim 1, wherein
the first conductive pattern layer further includes at least one spacer; each spacer is insulated from the plurality of first signal lines;
the vertical projection of the second lamp bead pad on the base is within a vertical projection of a spacer on the base.

3. The light-emitting substrate according to claim 2, wherein
the second lamp bead pad includes an anode pad and a cathode pad, the spacer includes a first pattern and a second pattern arranged at an interval; a vertical projection of the anode pad of the second lamp bead pad on the base is within a vertical projection of the first pattern on the base; a vertical projection of the cathode pad of the second lamp bead pad on the base is within a vertical projection of the second pattern on the base.

4. The light-emitting substrate according to claim 2, wherein the second lamp bead pad is insulated from the spacer.

5. The light-emitting substrate according to claim 2, wherein
the at least one spacer is one of a plurality of spacers, the at least one second lamp bead pad is one of a plurality of second lamp bead pads, and a number of the plurality of spacers is equal to a number of the plurality of second lamp bead pads.

6. The light-emitting substrate according to claim 2, wherein
the spacer includes a pattern;
the at least one second lamp bead pad is one of a plurality of second lamp bead pads; in the plurality of second lamp bead pads, vertical projections of at least two second lamp bead pads on the base are within a vertical projection of a same spacer on the base, wherein the at least two second lamp bead pads are connected in series.

7. The light-emitting substrate according to claim 1, wherein
the first direction intersects with the second direction;
each first signal line extends in the effective light-emitting region and the fan-out region;
the at least one second lamp bead pad is provided in a region of the fan-out region that is outside a region occupied by the plurality of first signal lines.

8. The light-emitting substrate according to claim 7, wherein
the second conductive pattern layer further includes a plurality of light-emitting driver pads;
the plurality of first signal lines include a plurality of driving voltage lines;
the plurality of lamp bead pads are divided into a plurality of pad groups, each pad group is composed of lamp bead pads connected in series, and in each pad group, an anode at a terminal is electrically connected to a driving voltage line, and a cathode at another terminal is electrically connected to a light-emitting driver pad; wherein the plurality of pad groups include a first pad group; the first pad group includes at least one first lamp bead pad and at least one second lamp bead pad connected in series; or the first pad group includes at least two second lamp bead pads connected in series.

9. The light-emitting substrate according to claim 8, wherein
the first pad group is located in the fan-out region; the first pad group is farther away from the effective light-emitting region than a light-emitting driver pad electrically connected to the first pad group.

10. The light-emitting substrate according to claim 8, wherein
the plurality of pad groups further includes a plurality of second pad groups, and the plurality of second pad groups and the first pad group are arranged in the second direction; wherein
in the first pad group, in an order from a driving voltage line connected to the first pad group to a light-emitting driver pad connected to the first pad group, a second lamp bead pad is farther away from the plurality of second pad groups than a first lamp bead pad;
in a second pad group, in an order from a driving voltage line connected to the second pad group to a light-emitting driver pad connected to the second pad group, a second lamp bead pad is farther away from the first pad group than a first lamp bead pad.

11. The light-emitting substrate according to claim 10, wherein
a distance between a second pad group and an adjacent first pad group is a first distance, and a distance between two adjacent second pad groups in the second direction is a second distance; the first distance is substantially the same as the second distance.

12. The light-emitting substrate according to claim 11, wherein
a light-emitting driver pad electrically connected to a second pad group adjacent to the first pad group is located on a side of the second pad group in the first direction.

13. The light-emitting substrate according to claim 8, wherein
the plurality of first signal lines include a plurality of source voltage lines and a plurality of common voltage lines;
the light-emitting substrate further comprises a plurality of light-emitting drivers, each light-emitting driver is electrically connected to a light-emitting driver pad;
a light-emitting driver includes a first input pin, an output pin, and a common voltage pin; the first input pin is electrically connected to a source voltage line, the output pin is electrically connected to a pad group, and the common voltage pin is electrically connected to a common voltage line.

14. The light-emitting substrate according to claim 13, wherein
the plurality of first signal lines further include a plurality of source address lines and a plurality of feedback lines; the light-emitting driver further includes a second input pin;
the plurality of light-emitting drivers are cascaded, and in the plurality of cascaded light-emitting drivers, a second input pin of a first-stage light-emitting driver is electrically connected to a source address line;

except the first-stage light-emitting driver, an output pin of a present-stage light-emitting driver is electrically connected to a second input pin of a next-stage light-emitting driver;

an output pin of a last-stage light-emitting driver is electrically connected to a feedback line.

15. The light-emitting substrate according to claim 8, wherein the second conductive pattern layer further includes a plurality of second signal lines; each second signal line connects two adjacent lamp bead pads in a same pad group in series.

16. The light-emitting substrate according to claim 1, wherein materials of the first conductive pattern layer and the second conductive pattern layer each include at least one of copper, aluminum or silver.

17. The light-emitting substrate according to claim 1, wherein materials of the first conductive pattern layer and the second conductive pattern layer are the same.

18. The light-emitting substrate according to claim 8, wherein the lamp bead pads connected in series includes four or six lamp bead pads.

19. A display apparatus, comprising a display panel and the light-emitting substrate according to claim 1; wherein the display panel is disposed on a light-exit side of the light-emitting substrate; the light-emitting substrate is used to provide a light source for the display panel.

20. The light-emitting substrate according to claim 2, wherein the second lamp bead pad is electrically connected to the spacer.

* * * * *